(12) United States Patent
Lee et al.

(10) Patent No.: US 9,049,788 B2
(45) Date of Patent: Jun. 2, 2015

(54) ELECTRICAL CONDUCTOR AND A PRODUCTION METHOD THEREFOR

(71) Applicant: LG CHEM, LTD., Seoul (KR)

(72) Inventors: Dong-Wook Lee, Daejeon (KR); In-Seok Hwang, Daejeon (KR); Sang-Ki Chun, Daejeon (KR); Ji-Young Hwang, Daejeon (KR); Hyeon Choi, Daejeon (KR); Young-Jun Hong, Daejeon (KR); Su-Jin Kim, Daejeon (KR); Ki-Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 317 days.

(21) Appl. No.: 13/785,715

(22) Filed: Mar. 5, 2013

(65) Prior Publication Data
US 2013/0248239 A1  Sep. 26, 2013

Related U.S. Application Data

(63) Continuation of application No. 13/384,096, filed as application No. PCT/KR2010/004675 on Jul. 16, 2010, now Pat. No. 8,692,445.

(30) Foreign Application Priority Data

Jul. 16, 2009 (KR) .................. 10-2009-0065103
Jul. 16, 2009 (KR) .................. 10-2009-0065106
Jul. 16, 2010 (KR) .................. 10-2010-0069157

(51) Int. Cl.
*H01J 1/26* (2006.01)
*H05K 1/02* (2006.01)
(Continued)

(52) U.S. Cl.
CPC ......... *H05K 1/0296* (2013.01); *Y10T 29/49155* (2015.01); *H01L 51/5212* (2013.01);
(Continued)

(58) Field of Classification Search
CPC ...... H05K 1/0296; H05K 3/10; H05K 9/0064
USPC .................. 313/112; 29/846; 174/250, 255
See application file for complete search history.

(56) References Cited

U.S. PATENT DOCUMENTS 6,204,520 B1  3/2001  Ha et al.
6,377,138 B1  4/2002  Takagi et al.
(Continued)

FOREIGN PATENT DOCUMENTS

CN  1236505 A  11/1999
CN  1975517 A  6/2007
(Continued)

OTHER PUBLICATIONS

Office Action of Chinese Patent Office in Application No. 201080007007.6, dated Apr. 24, 2013.
(Continued)

*Primary Examiner* — Andrew Coughlin
(74) *Attorney, Agent, or Firm* — McKenna Long & Aldridge LLP

(57) ABSTRACT

Provided are an electrical conductor and a production method therefor; the electrical conductor comprising a transparent substrate and an electro-conductive pattern provided on at least one surface of the transparent substrate, and the electro-conductive pattern being of a type such that, for at least 30% of the entire surface area of the transparent substrate, when a straight line is drawn intersecting the electroconductive pattern, the ratio of the standard deviation to the mean value of the distances between adjacent points of intersection between the straight line and the electroconductive pattern (the distance distribution ratio) is at least 2%. Also, provided are an electrical conductor and a production method therefor; the electrical conductor comprising a transparent substrate and an electroconductive pattern provided on at least one surface of the transparent substrate, and the electroconductive pattern being of a type such that at least 30% of the entire surface area of the transparent substrate is accounted for by continuously distributed closed motifs, and the ratio of the standard deviation to the mean value of the surface areas of the closed motifs (the surface area distribution ratio) is at least 2%.

43 Claims, 16 Drawing Sheets

(51) Int. Cl.
*H01L 51/52* (2006.01)
*H05K 3/10* (2006.01)
*H05K 9/00* (2006.01)
*G06F 3/041* (2006.01)
*G06F 3/044* (2006.01)

(52) U.S. Cl.
CPC .............. *H05K 3/10* (2013.01); *H05K 9/0064* (2013.01); *G06F 3/041* (2013.01); *G06F 3/044* (2013.01); *G06F 2203/04103* (2013.01); *G06F 2203/04112* (2013.01)

(56) References Cited

U.S. PATENT DOCUMENTS

| | | | |
|---|---|---|---|
| 7,932,183 | B2 | 4/2011 | Itoh et al. |
| 2003/0017422 | A1 | 1/2003 | Yamaguchi |
| 2003/0052078 | A1 | 3/2003 | Sakayori et al. |
| 2004/0229028 | A1 | 11/2004 | Sasaki et al. |
| 2005/0158639 | A1 | 7/2005 | Yamaguchi et al. |
| 2006/0256095 | A1 | 11/2006 | Bottari et al. |
| 2007/0031140 | A1 | 2/2007 | Biernath et al. |
| 2007/0097278 | A1 | 5/2007 | Rho et al. |
| 2008/0272697 | A1 | 11/2008 | Cha et al. |
| 2009/0029127 | A1 | 1/2009 | Watanabe et al. |
| 2010/0053759 | A1 | 3/2010 | Inoue et al. |
| 2010/0206628 | A1 | 8/2010 | Matsui et al. |
| 2010/0244666 | A1 | 9/2010 | Tanaka |
| 2012/0162116 | A1* | 6/2012 | Philipp .................. 345/173 |

FOREIGN PATENT DOCUMENTS

| | | |
|---|---|---|
| CN | 101189930 A | 5/2008 |
| EP | 0127794 | 12/1984 |
| EP | 0127794 A2 | 12/1984 |
| EP | 2059095 A1 | 5/2009 |
| JP | 1976-097770 A | 8/1976 |
| JP | 1993-054326 A | 3/1993 |
| JP | 06-204536 A | 7/1994 |
| JP | 1998-200234 A | 7/1998 |
| JP | 2000315683 A | 11/2000 |
| JP | 2000315890 A | 11/2000 |
| JP | 2001-077098 | 3/2001 |
| JP | 2003-069188 A | 3/2003 |
| JP | 2004-221564 A | 8/2004 |
| JP | 2006344163 A | 12/2006 |
| JP | 2008009921 A | 1/2008 |
| JP | 2008-084837 | 4/2008 |
| JP | 2008-84837 A | 4/2008 |
| JP | 2008083497 A | 4/2008 |
| JP | 2008134975 A | 6/2008 |
| JP | 2008-251822 A | 10/2008 |
| JP | 2009009249 A | 1/2009 |
| JP | 2009-176198 A | 8/2009 |
| JP | 2010-079240 A | 4/2010 |
| KR | 100442556 B1 | 7/2004 |
| KR | 10-2008-0042111 | 5/2008 |
| KR | 10-2008-0042111 A | 5/2008 |
| KR | 2008-0042111 A | 5/2008 |
| KR | 10-2008-0104587 | 12/2008 |
| KR | 10-2008-0104587 A | 12/2008 |
| KR | 10-2009-0048610 | 5/2009 |
| KR | 10-2009-0048610 A | 5/2009 |
| KR | 10-2009-0051007 | 5/2009 |
| KR | 10-2009-0051007 A | 5/2009 |
| TW | 493285 B | 7/2002 |
| TW | 200818981 A | 4/2008 |
| WO | 2008-029776 A1 | 3/2008 |
| WO | 2008/029776 A1 | 3/2008 |

OTHER PUBLICATIONS

Office Action of Japanese Patent Office in Application No. 2012-520547, dated Apr. 2, 2013.
Office Action of Japanese Patent Office in Application No. 2012-520547, dated Mar. 17, 2014.
Office Action of Chinese Patent Office in Application No. 201080007009.5, dated Feb. 25, 2014.
Printed Circuits Handbook, Sixth Edition, Clyde F. Coombs, Jr, 2008, McGraw-Hill, ISBN: 978-0-07-146734-6, p. 34.22-34.25.

* cited by examiner

1. FIRST TRANSFER BY ROTATING BLANKET AFTER PASTE IS FILLED
   IN THE PATTERN OF THE INTAGLIO BY USING THE DOCTOR BLADE

2. SECOND TRANSFER ON GLASS SURFACE BY ROTATING BLANKET

1. PREDETERMINED DOT
   DISTRIBUTION GENERATION

2. CHANGE INTO UNIFORM/ATYPICAL
   DOT DISTRIBUTION

FIG. 19

| ROTATION ANGLE | GENERAL MESH | IRREGULAR PATTERN |
|---|---|---|
| 0° | O | X |
| 45° | X | X |
| 90° | X | X |
| 135° | O | X |
| 180° | O | X |
| 225° | X | X |
| 270° | O | X |
| 315° | O | X |
| 360° | O | X |

FIG. 20

| ROTATION ANGLE | GENERAL MESH | IRREGULAR PATTERN |
|---|---|---|
| 0° | O | X |
| 45° | X | X |
| 90° | O | X |
| 135° | X | X |
| 180° | O | X |
| 225° | O | X |
| 270° | O | X |
| 315° | O | X |
| 360° | O | X |

[TOUCH SCREEN ON THE BASIS
OF KNOWN ITO]

[TOUCH SCREEN ON THE BASIS
OF PRINTING USING VORONO I]

[BEFORE BLACKENING]     [AFTER BLACKENING]

[BUS ELECTRODE FOR KNOWN OLED LIGHTING]     [BUS ELECTRODE USING VORONOI]

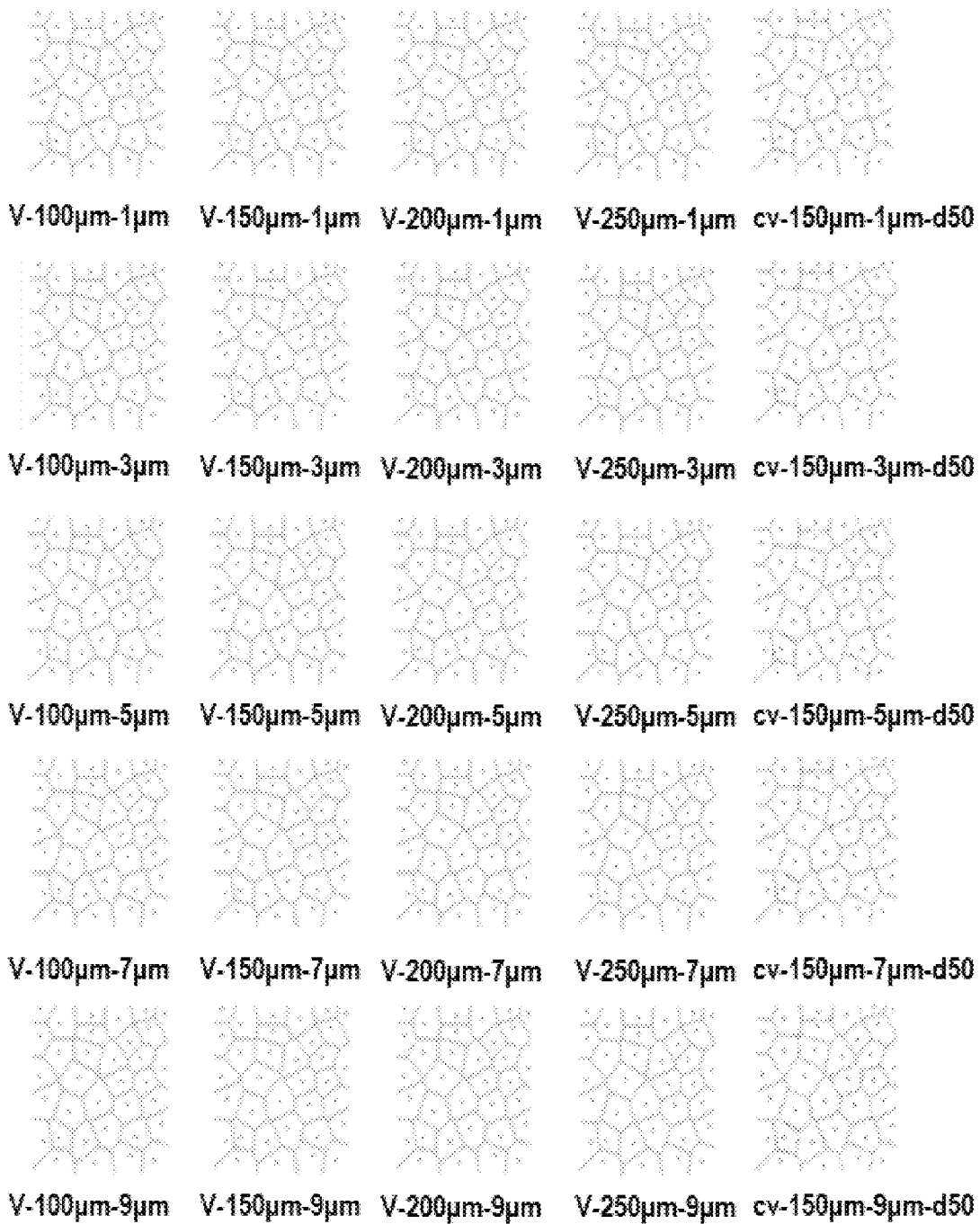
FIG. 27 (1)

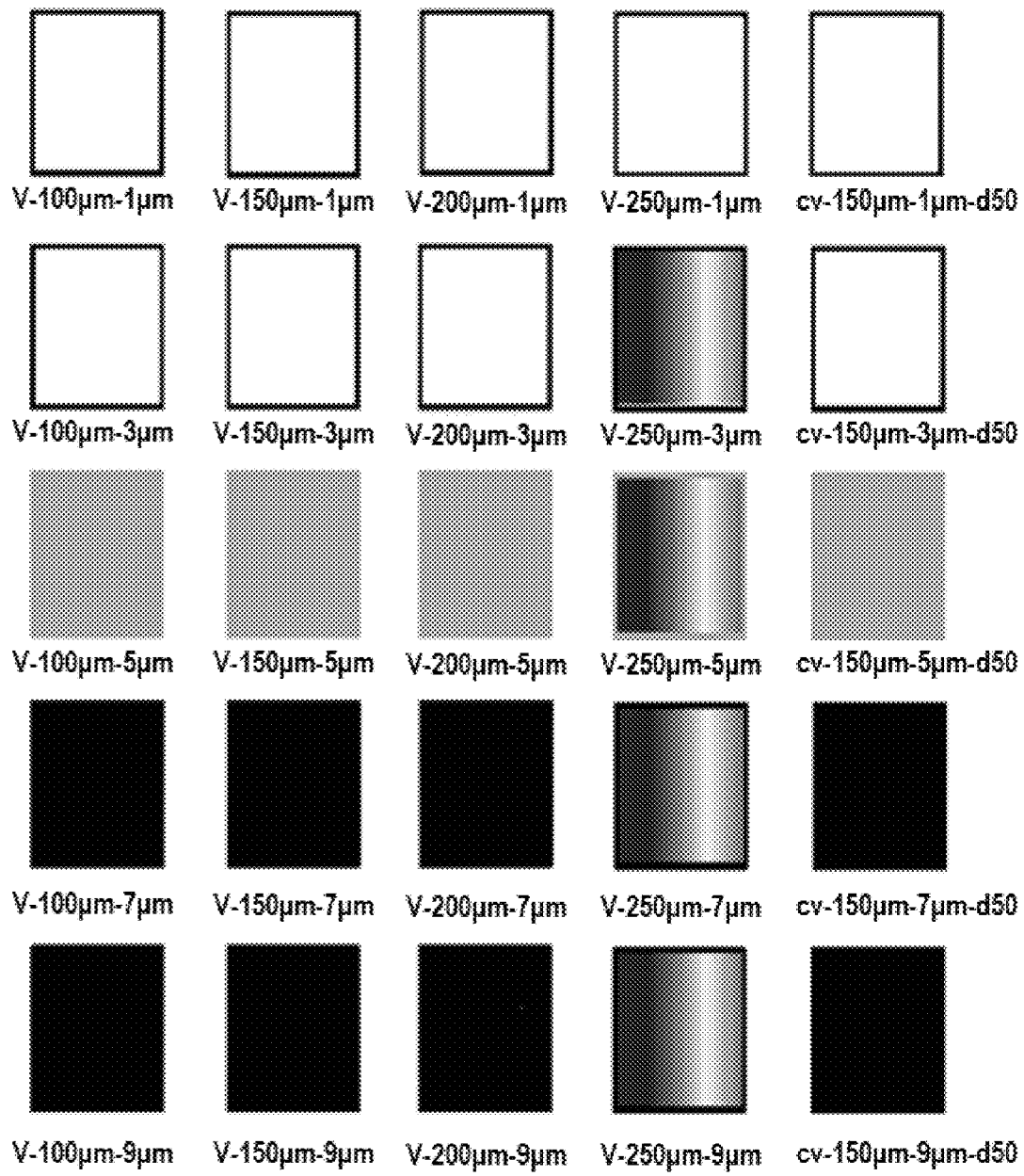
FIG. 27 (2)

ELECTRICAL CONDUCTOR AND A PRODUCTION METHOD THEREFOR

This application is a Continuation of U.S. patent application Ser. No. 13/384,096, filed on Jan. 13, 2012, which is the national stage application of PCT/KR2010/004675, filed Jul. 16, 2010, which claims priority to Korean Patent Application Nos. 10-2009-0065103, filed on Jul. 16, 2009, 10-2009-0065106, filed on Jul. 16, 2009, and 10-2010-0069157, filed on Jul. 16, 2010, all of which are incorporated herein by reference in their entirety.

TECHNICAL FIELD

The present invention relates to an electrical conductor and a production method therefor.

The present application claims priority to Korean Patent Application Nos. 10-2009-0065103 and 10-2009-0065106 filed on Jul. 16, 2009 and Korean Patent Application No. 10-2010-0069157 filed on Jul. 16, 2010, the entire contents of which application is incorporated herein for all purposes by this reference.

BACKGROUND OF THE INVENTION

In general, a display device is monitors for TV or computers, and includes a display diode that forms an image and a case that supports the display diode.

As a display diode, there may be exemplified by plasma display panel (PDP), liquid crystal display (LCD), electrophoretic display and cathode-ray tube (CRT). In a display diode, an RGB pixel pattern and additional optical filter for implementing an image may be provided.

An optical filter may include at least one of an anti-reflective film that prevents the reflection of the light that is incident from an outside to the outside, a near IR shield film that shields near infrared light that is generated in a display diode in order to prevent the disoperation of electronic devices such as remote controllers and the like, a color correction film that includes a color control dye and increases a color purity by controlling a color tone, and an electromagnetic wave shield film that shields an electromagnetic wave that is generated in a display diode when a display device is driven. An electromagnetic wave shield film includes a transparent substrate and a metal mesh pattern that is provided on the substrate.

Recently, according to the rapid spreading of IPTVs, a demand for touch function that a direct input device uses without a separate input device such as remote controllers has been increased. In addition, a function for specific point recognition and multi-touch function that can perform writing are required.

A touch panel may be classified into a resistive type touch panel, a capacitive type touch panel and an electromagnetic type touch panel. A resistive type touch panel detects the position that is pressed by a pressure by detecting a change in current or voltage value, in response to the application of a direct voltage. A capacitive type touch panel uses a capacitance coupling in a state where an alternating voltage is applied. An electromagnetic type touch panel detects the selected position by a change in voltage in a state where a magnetic field is applied.

Among them, the resistive type and capacitive type touch panels recognize the touch by a change in electric contact or capacitance by using a transparent conductive film such as the ITO film. However, since a transparent conductive film has the high resistance of 100 ohms/square or more, the sensitivity is lowered when it is manufactured in a large scale. Further, a high cost of ITO film makes the commercialization of a large-scale screen. In order to reduce a manufacturing cost, there is an effort to adopt a metal pattern on a touch panel.

When a display device includes an electromagnetic wave shield film or a touch panel that includes a metal pattern, a Moire phenomenon may be caused by the interference between the metal pattern and a pixel pattern of the display, electrode pattern or pattern structure of the other optical film. Here, the Moire phenomenon means an interference fringe generated when two or more regular patterns overlap.

In a plasma display panel (PDP), since a pixel pattern of the plasma display panel (PDP) and a metal mesh pattern for electromagnetic wave shielding of an optical filter coexist, a Moire phenomenon may occur. Therefore, in general, if a specification of the plasma display panel (PDP) is determined, an effort for solving the Moire phenomenon is required.

In order to remove a Moire phenomenon, the line width and pitch and angle of the metal mesh pattern for the electromagnetic wave shielding are controlled, but there is a problem in that it should correspond to different patterns according to the size and the pixel implementation method of the display device.

A plasma display panel that is currently developed, in order to implement high resolution, includes a more precise pixel pattern, such that the occurrence possibility of a Moire phenomenon is increased. Accordingly, there is a limit in improvement of the Moire phenomenon by using only the line width, pitch, and angle of the known pattern.

Disclosure

The present invention provides an electrical conductor that has a pattern that does not obstruct the field of vision, has excellent conductivity, and prevents a Moire phenomenon, and a method for manufacturing the same.

An embodiment of the present invention provides an electrical conductor that includes a transparent substrate; and an electric conductive pattern that is provided on at least one side of the transparent substrate, wherein 30% or more of the entire area of the transparent substrate has the electric conductive pattern in which a ratio (distance distribution ratio) of standard deviation in respects to an average value of distances between adjacent intersection points of the straight line and the electric conductive pattern is 2% or more when the straight line that crosses the electric conductive pattern is drawn. It is preferable that the straight line that crosses the electric conductive pattern is a line in which the closest distance deviation of the intersection points with the electric conductive pattern is small. In addition, it may be a line that vertically extends in respects to the tangent line of any one point of the electric conductive pattern.

Another embodiment of the present invention provides a method for manufacturing an electrical conductor that includes forming an electric conductive pattern on a transparent substrate, wherein 30% or more of the entire area of the transparent substrate has the electric conductive pattern in which a ratio (distance distribution ratio) of standard deviation in respects to an average value of distances between adjacent intersection points of the straight line and the electric conductive pattern is 2% or more when the straight line that crosses the electric conductive pattern is drawn. The electric conductive pattern may be formed by using a printing method, a photolithography method, a photography method, a method using a mask, a sputtering method, or an inkjet method.

Still another embodiment of the present invention provides an electrical conductor that includes a transparent substrate; and an electric conductive pattern that is provided on at least one side of the transparent substrate, wherein 30% or more of the entire area of the transparent substrate is formed of closed figures in which distributions are continuous, and the electrical conductor has the electric conductive pattern in which a ratio (distance distribution ratio) of standard deviation in respects to an average value of areas of the closed figures is 2% or more.

Yet another embodiment of the present invention provides a method for manufacturing an electrical conductor, which includes forming an electric conductive pattern on a transparent substrate, wherein 30% or more of the entire area of the transparent substrate is formed of closed figures in which distributions are continuous, and the electrical conductor has the electric conductive pattern in which a ratio (distance distribution ratio) of standard deviation in respects to an average value of areas of the closed figures is 2% or more. The electric conductive pattern may be formed by using a printing method, a photolithography method, a photography method, a method using a mask, a sputtering method, or an inkjet method.

Still yet another embodiment of the present invention provides an electromagnetic wave shield film that includes an electrical conductor, a touch panel, a display, and organic light emitting diode (OLED) lighting.

Advantageous Effects

According to the embodiments of the present invention, the electrical conductor may not obstruct the field of vision, have excellent conductivity, and prevent a Moire phenomenon. In addition, since the electrical conductor according to the present invention can be formed by using various methods such as using a printing method, a photolithography method, a photography method, a method using a mask, a sputtering method, or an inkjet method after a desired pattern is previously set, the process is easily performed and the cost is low.

BRIEF DESCRIPTION OF THE DRAWINGS

FIG. 19 is an example that compares the occurrence of Moire phenomenon for each angle after the electrical conductor that includes the electric conductive pattern according to an embodiment of the present invention and a known PDP filter overlap at the distance of 5 cm from the 42" (inch) PDP;

FIG. 20 is an example that compares the occurrence of Moire phenomenon for each angle after the electrical conductor that includes the electric conductive pattern according to an embodiment of the present invention and a known PDP filter overlap at the distance of 5 cm from the 42" (inch) PDP;

FIG. 27 illustrates a Moire phenomenon according to the line width and pitch.

DETAILED DESCRIPTION OF THE EMBODIMENTS

Figure 1:
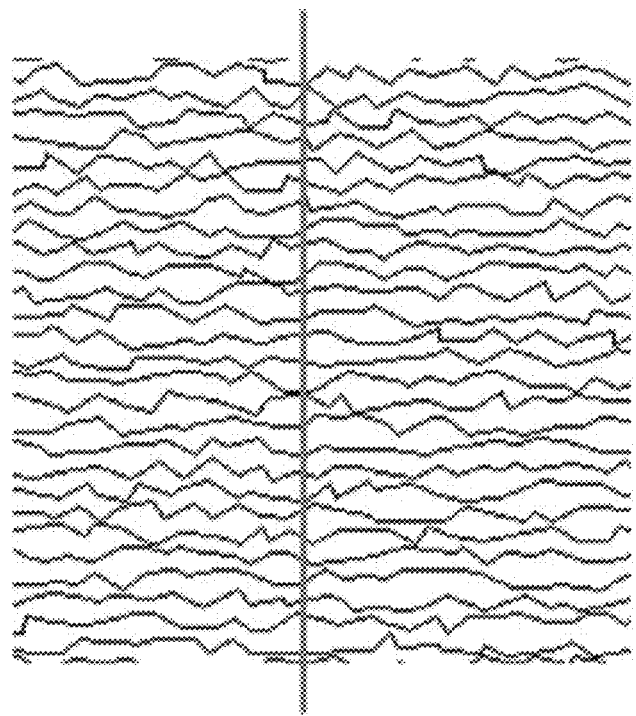
FIG. 1 and FIG. 2 illustrate a state in which a predetermined straight line is drawn on an electric conductive pattern of an electrical conductor according to an embodiment of the present invention.

Hereinafter, the present invention will be described in more detail.

An electrical conductor according to an exemplary embodiment of the present invention is an electrical conductor that includes a transparent substrate and an electric conductive pattern that is provided on at least one side of the transparent substrate, wherein 30% or more of the entire area of the transparent substrate has the electric conductive pattern. When the straight line that crosses the electric conductive pattern is drawn, a ratio (distance distribution ratio) of standard deviation in respect to an average value of distances between adjacent intersection points of the straight line and the electric conductive pattern is 2% or more.

In addition, an electrical conductor according to another exemplary embodiment of the present invention includes a transparent substrate and an electric conductive pattern that is provided on at least one side of the transparent substrate, wherein 30% or more of the entire area of the transparent substrate is formed of closed figures in which distributions are continuous. The electrical conductor has the electric conductive pattern in which a ratio (area distribution ratio) of standard deviation in respect to an average value of areas of the closed figures is 2% or more.

As in the related art, in the case where the transparent conductive layer is formed on the entire area, there is a problem in that resistance is very high. In addition, in the case where the electric conductive pattern that is formed of one or more kind of regular pattern is included in a regular internal structure, a relative interference between the patterns occurs by the light source that is adjacent to the pattern structures, such that a Moire phenomenon occurs. The regular pattern may be a pattern using the grid method or linear method. For example, the regular internal structure may be a display that has a pixel structure, an optical film that has a regular pattern structure or a display that includes an electrode structure. If the Moire phenomenon occurs, visual recognition ability (visibility) is lowered. Therefore, in order to solve this, in the exemplary embodiment of the present invention, in consideration that the regularity of the pattern causes the Moire phenomenon, it is possible to prevent the occurrence of the Moire phenomenon by making the pattern irregular.

In the exemplary embodiment of the present invention, as described above, when 30% or more, specifically 70% or more, and more specifically 90% or more of the entire area of the transparent substrate has the electric conductive pattern in which a ratio (distance distribution ratio) of standard deviation is 2% or more when the straight line that crosses the electric conductive pattern is drawn. It is possible to provide the electrical conductor that may prevent the Moire phenomenon, and may satisfy excellent electric conductivity and optical properties. Here, the ratio (distance distribution ratio) of standard deviation means a ratio of standard deviation in respect to an average value of distances between adjacent intersection points of the straight line and the electric conductive pattern.

In the exemplary embodiment of the present invention, the straight line that crosses the electric conductive pattern may be a line in which the standard deviation of the distances between adjacent intersection points of the straight line and the electric conductive pattern has the smallest value. In addition, the straight line that crosses the electric conductive pattern may be a straight line that vertically extends in respect to the tangent line of any one point of the electric conductive pattern.

In the electrical conductor according to the exemplary embodiment of the present invention, the straight line that crosses the electric conductive pattern may have 80 intersection points with the electric conductive pattern.

The ratio (distance distribution ratio) of standard deviation in respect to an average value of distances between adjacent intersection points of the straight line that crosses the electric conductive pattern and the electric conductive pattern may be 2% or more, more specifically 10% or more, and even more specifically 20% or more.

The pattern in which the ratio (distance distribution ratio) of standard deviation in respect to an average value of distances between adjacent intersection points of the straight line that crosses the electric conductive pattern and the electric conductive pattern is 2% or more may be 30% or more of the entire area of the transparent substrate. Another type of electric conductive pattern may be provided on at least a portion of the surface of the transparent substrate that is provided with the electric conductive pattern described above.

In the electrical conductor according to the exemplary embodiment of the present invention, the number of the closed figures may be at least 100.

The ratio (area distribution ratio) of standard deviation in respect to an average value of areas of the closed figures is specifically 2% or more, more specifically 10% or more, and even more specifically 20% or more.

The pattern that is formed of the closed figures in which the ratio (area distribution ratio) of standard deviation in respect to an average value of areas thereof is 2% or more may be 30% or more in respect to the entire area of the transparent substrate. Another type of electric conductive pattern may be provided on at least a portion of the surface of the transparent substrate that is provided with the electric conductive pattern described above.

After the electrical conductor according to the exemplary embodiment of the present invention is disposed at the distance of 5 cm or less from the device that has the regular pattern, like the pixel pattern or color filter pattern, for example, the display, when the device is observed at an angle of 0 to 80° in respect to the line that is vertical to the transparent substrate, the interference pattern by the Moire phenomenon is not observed.

In addition, after the electrical conductor according to the exemplary embodiment of the present invention is used as the electromagnetic wave shield (EMI) film to manufacture the 42-inch PDP, in order to measure an electromagnetic wave shield (EMI) ability level, the frequency of the area band between the 30 MHz and 1000 MHz is measured at the interval distance of 3 m. As a result, the electromagnetic wave shield (EMI) ability that has the Class B level or more is confirmed. In this case, when the PDP is observed at an angle of 0 to 80° in respect to the line that is vertical to the transparent substrate, the interference pattern by the Moire phenomenon is not observed.

In addition, after the touch screen of 40-inch projected capacitance type is manufactured by using the electrical conductor according to the exemplary embodiment of the present invention, the linearity evaluation is performed to evaluate the precision of the touch screen. As a result, it is possible to implement the touch screen that has higher precision as compared to the known ITO-based touch screen. In this case, when the touch screen is observed at an angle of 0 to 80° in respect to the line that is vertical to the touch screen, the interference pattern by the Moire phenomenon is not observed.

Meanwhile, in the case where the patterns are completely irregular, in the distribution of the line, there may be a difference between a loose portion and a dense portion thereof. In the distribution of the line, although the line width may be thin, a problem of visual recognition may occur. In this case, a condition that is required for the purpose of the electrical conductor may not be satisfied.

For example, in the case where the electrical conductor is used for an electromagnetic wave shield, if the pattern is completely irregular and the interval between some patterns are very wide, the electromagnetic wave can pass through the patterns that have the wide interval, such that defects may occur.

In addition, in the case where the electrical conductor is used for a touch panel, if the loose portion and the dense portion of the pattern are formed, resistance or capacitance becomes irregular, such that the touched position may be wrongly recognized.

In order to solve this problem, in the exemplary embodiment of the present invention, when the electric conductive pattern is formed, regularity and irregularity may be appropriately harmonized. For example, the basic unit is set so that the electric conductive pattern is observed or the local conductivity is not generated, and the electric conductive pattern may be irregularly formed in the basic unit. If the above method is used, the visuality is compensated and the specification for the purpose of the products can be satisfied by preventing the localization of the distribution of the electric conductive pattern on any one point.

As described above, for uniform electric conductivity and visuality of the electrical conductor, the opening ratio of the pattern may be constant in the unit area. The permeability deviation of the electrical conductor may be 5% or less in respect to a predetermined circle that has the diameter of 20 cm. In this case, the electrical conductor may prevent the local conductivity.

In the exemplary embodiment of the present invention, the electric conductive pattern may be formed of straight lines, or various modifications such as curved lines, wave lines, and zigzag lines may be feasible. In addition, at least two of the above lines may be mixed with each other.

Figure 2:
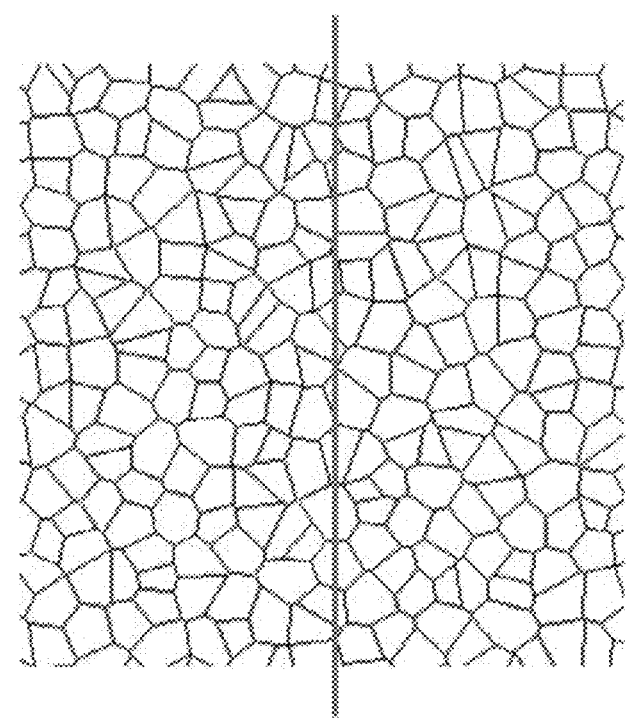
Figure 6:
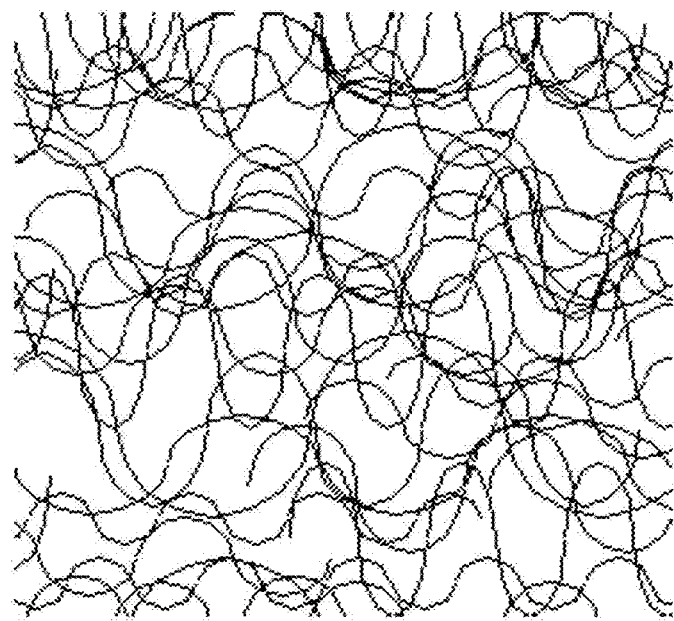
FIG. 6 illustrates the electric conductive pattern of the electrical conductor according to the present invention.

FIGS. 1 and 2 illustrate a state in which a predetermined line is drawn on an electric conductive pattern according to an exemplary embodiment of the present invention. However, the scope of the present invention is not limited thereto. FIG. 1 illustrates a one-dimensional state in which the electric conductive patterns do not cross each other, and FIG. 2 illustrates a two-dimensional state in which the electric conductive patterns cross each other and a form of a closed figure is formed on some areas. An example of another electric conductive pattern is illustrated in FIG. 6, but the scope of the present invention is not limited thereto.

Figure 3:
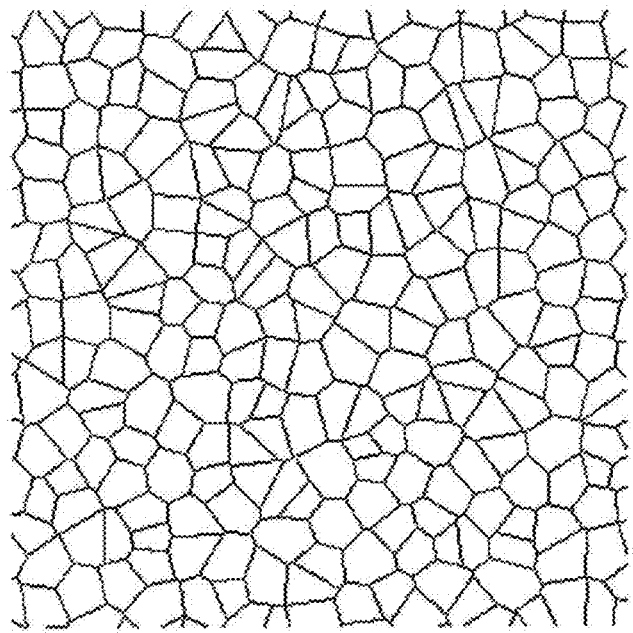
FIG. 3 illustrates the electric conductive pattern of the electrical conductor according to an embodiment of the present invention.

FIG. 3 illustrates the electric conductive pattern according to the embodiment of the present invention. The area distribution ratio of the pattern is 20% or more, for example, 20 to 35%.

According to an embodiment of the present invention, the electric conductive pattern may be a boundary shape of the figures that form a Voronoi diagram.

In the exemplary embodiment of the present invention, the Moire phenomenon may be prevented by forming the electric conductive pattern in a boundary form of the figures that form the Voronoi diagram.

The Voronoi diagram is a pattern that is formed by filling the closest area to the corresponding dot as compared to the distance of each dot from other dots if Voronoi diagram generator dots are disposed in a desired area to be filled. For example, when large discount stores in the whole country are represented by dots and consumers find the closest large discount store, the pattern that displays the commercial area of each discount store may be exemplified. That is, if a space is filled with a regular hexagon and each dot of the regular hexagon is selected by the Voronoi generator, the electric conductive pattern may be a honeycomb structure.

Figure 7:
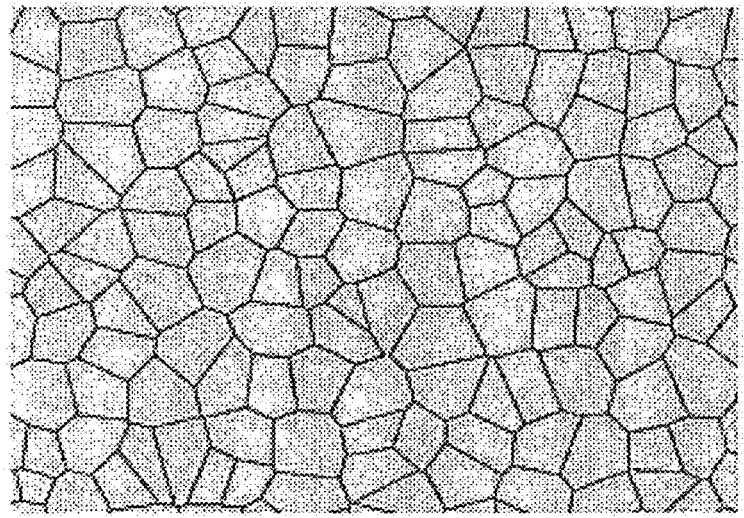
FIGS. 7 to 9 illustrate the electric conductive pattern of the electrical conductor according to the present invention.
Figure 8:
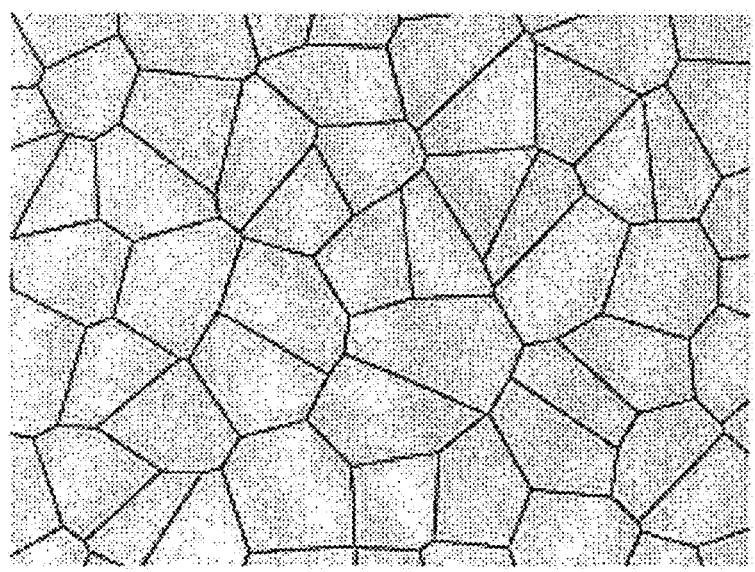
Figure 9:
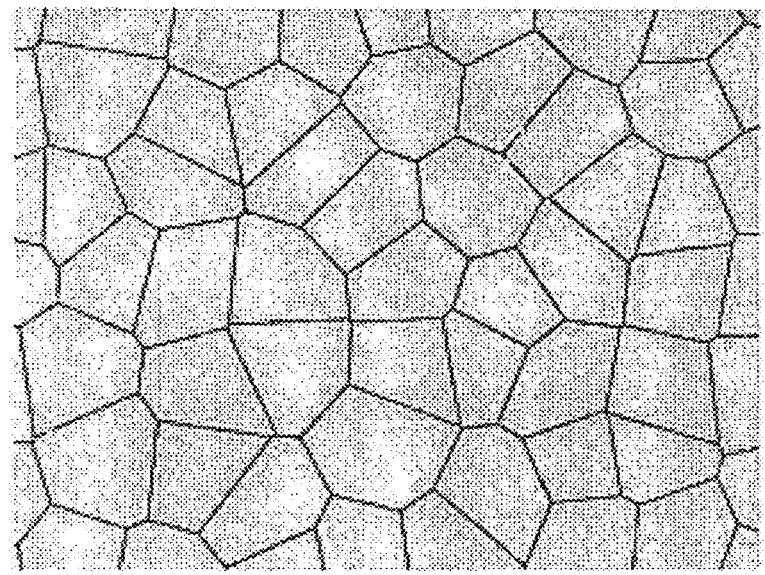
Figure 10:
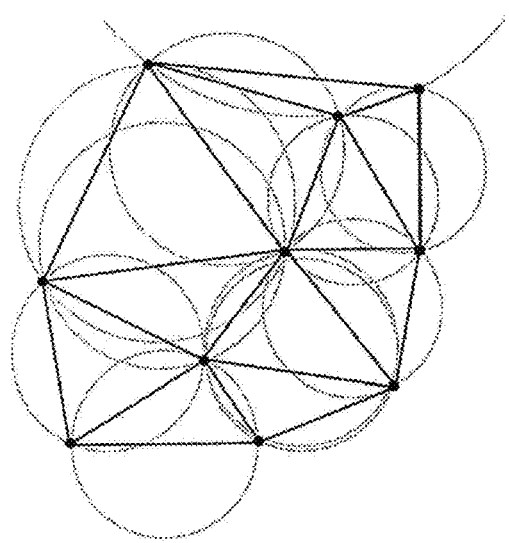
FIG. 10 illustrates forming the pattern by using the Delaunay pattern generator according to an embodiment of the present invention.

In the exemplary embodiment of the present invention, in the case where the electric conductive pattern is formed by using the Voronoi diagram generator, there is a merit in that a complex pattern form that can prevent the Moire phenomenon that may be generated by an interference with another regular pattern may be easily determined. FIG. 3 illustrates the forming of the pattern using the Voronoi diagram generator. An example of the conductive pattern is illustrated in FIGS. 7 to 9, but the scope of the present invention is not limited thereto.

In the exemplary embodiment of the present invention, the pattern that is derived from the generator may be used by regularly or irregularly positioning the Voronoi diagram generator.

In the case where the electric conductive pattern is formed in a boundary form of the figures that form the Voronoi diagram, in order to solve the visual recognition problem described above, when the Voronoi diagram generator is generated, the regularity and irregularity may be appropriately harmonized. For example, after the area having a predetermined size is set as the basic unit in the area in which the pattern is provided, the dots are generated so that the distribution of dots in the basic unit has the irregularity, thus manufacturing the Voronoi pattern. If the above method is used, the visuality can be compensated by preventing the localization of the distribution of lines on any one point.

As described above, in the case where the opening ratio of the pattern is made constant in the unit area for the uniform conductivity and visuality of the electrical conductor, it is possible to control the number per unit area of the Voronoi diagram generator. In this case, when the number per unit area of the Voronoi diagram generator is uniformly controlled, the unit area is specifically 5 $cm^2$ or less and more specifically 1 $cm^2$ or less. The number per unit area of the Voronoi diagram generator is specifically 25 to 2,500/$cm^2$ and more specifically 100 to 2,000/$cm^2$.

Among the figures that form the pattern in the unit area, at least one has specifically the different shape from the remaining figures.

According to another exemplary embodiment of the present invention, the electric conductive pattern may be a boundary form of the figures that are formed of at least one triangle forming the Delaunay pattern. In detail, the form of the electric conductive pattern is a boundary form of the triangles that form the Delaunay pattern, a boundary form of at least two triangles that form the Delaunay pattern, or a combined form thereof.

The side effects due to diffraction and interference of light may be minimized by forming the electric conductive pattern in the boundary form of the figures that are formed of at least one triangle that forms the Delaunay pattern.

Figure 11:
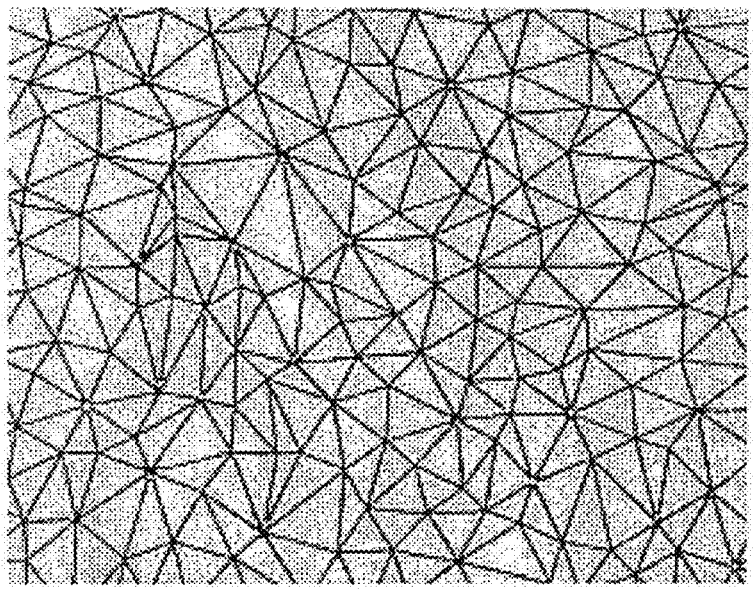
FIGS. 11 to 13 illustrate the electric conductive pattern of the electrical conductor according to the present invention.
Figure 12:
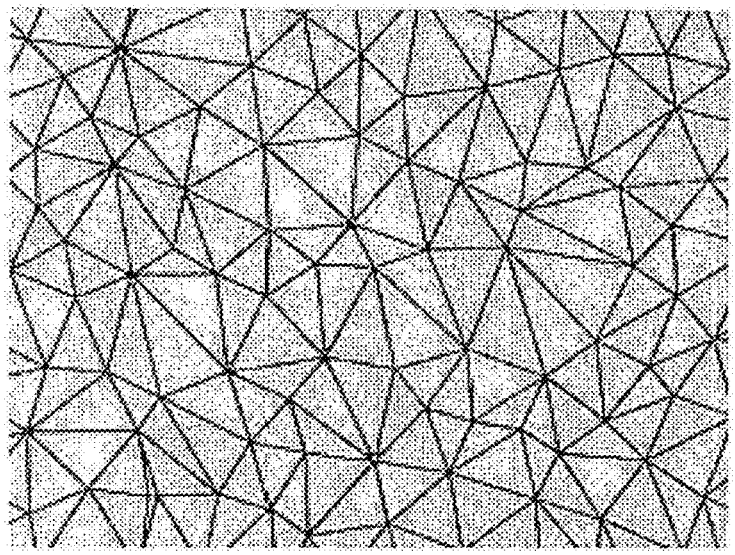
Figure 13:
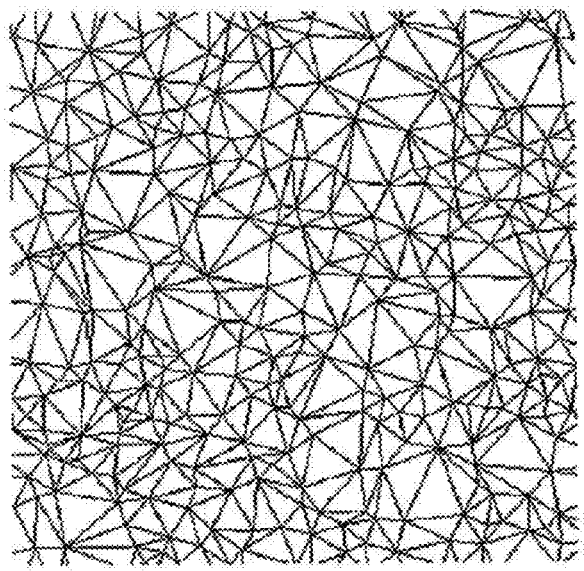

The Delaunay pattern is a pattern that is formed by disposing the Delaunay pattern generator dots in the area in which the pattern will be filled and drawing a triangle by connecting three dots therearound so that when the circumcircle that includes all corners of the triangle is drawn, there is no other dot in the circumcircle. In order to form the pattern, Delaunay triangulation and circulation may be repeated on the basis of the Delaunay pattern generator. The Delaunay triangulation may be performed in such a way that a thin triangle is avoided by maximizing the minimum angle of all angles of the triangle. The concept of the Delaunay pattern was proposed by Boris Delaunay in 1934. An example of forming the Delaunay pattern is shown in FIG. 7. In addition, an example of the Delaunay pattern is shown in FIG. 11 to FIG. 13. However, the scope of the present invention is not limited thereto.

The pattern of the boundary form of the figures that are formed of at least one triangle that forms the Delaunay pattern may use the pattern that is derived from the generator by regularly or irregularly positioning the Delaunay pattern generator. In the exemplary embodiment of the present invention, in the case where the electric conductive pattern is formed by using the Delaunay pattern generator, there is a merit in that a complex pattern form that can prevent the Moire phenomenon can be easily determined.

Even in the case where the electric conductive pattern is formed in a boundary form of the figures that are formed of at least one triangle that forms the Delaunay pattern, as described above, in order to solve the visual recognition problem and local conductivity problem, when the Delaunay pattern generator is generated, the regularity and irregularity may be appropriately harmonized. For example, an irregular and uniform standard dot is first generated in the area in which the pattern is provided. In this case, the irregularity means that the distances between the dots are not constant, and the uniformity means that the number of dots that are included per unit area is the same as each other.

Figure 14:
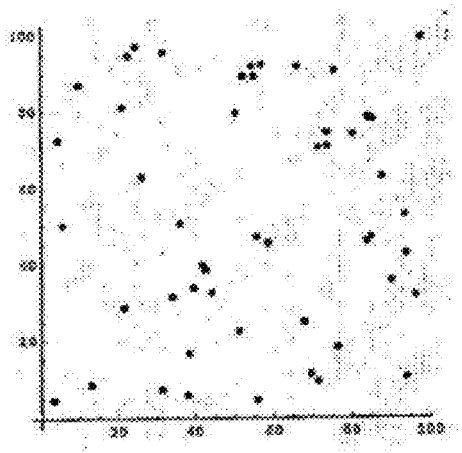
FIG. 14 illustrates the arrangement of the Delaunay pattern generator according to an embodiment of the present invention.
Figure 14:
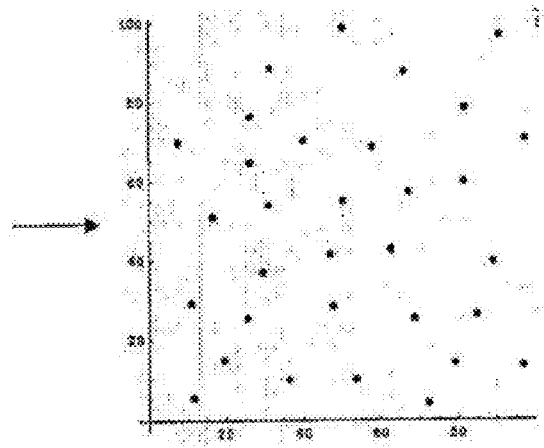

An example of the method for generating the irregular and uniform standard dots will be exemplified below. As shown in FIG. 14A, a predetermined dot is generated on the entire area. After that, the interval between the generated dots is measured, and in the case where the interval between the dots is smaller than the value that is previously set, the dots are removed. In addition, the Delaunay triangle pattern is formed on the basis of the dots, and in the case where the area of the triangle is larger than the value that is previously set, the dots are added in the triangle. The above process is performed repeatedly, and as a result, as shown in FIG. 14B, the irregular and uniform standard dots are generated. Next, the Delaunay triangle that includes one generated standard dot is generated. This step may be performed by using the Delaunay pattern. If the above method is used, the visuality can be compensated by preventing the localization of the distribution of lines on any one point.

As described above, in the case where the opening ratio of the pattern is made constant in the unit area for the uniform conductivity and visuality of the electrical conductor, the number per unit area of the Delaunay pattern generator may be controlled. In this case, when the number per unit area of the Delaunay pattern generator is uniformly controlled, the unit area is specifically 5 $cm^2$ or less and more specifically 1 $cm^2$ or less. The number per unit area of the Delaunay pattern generator is specifically 25 to 2,500/$cm^2$ and more specifically 100 to 2,000/$cm^2$.

Among the figures that form the pattern in the unit area, at least one has specifically the different shape from the remaining figures.

In the exemplary embodiment of the present invention, in the case where the electric conductive pattern described above is formed on the transparent substrate by using the method to be described below, the line width and line height may be made uniform. According to an exemplary embodiment of the present invention, at least a portion of the electric conductive pattern may be artificially formed to be different from the remaining pattern. The desired electric conductive pattern may be obtained by this configuration.

For example, in the case where it is required that the electric conductivity of a portion of the area is higher than that of the remaining area according to the purpose, or in the case of the touch panel electrode, the touch recognition of a portion of the area is more sensitively required, the electric conductive patterns of the corresponding area and the remaining area may be different from each other. The line widths and line intervals of the printing pattern may be different from each other so that at least a portion of the electric conductive pattern is different from the remaining printing pattern. As an example thereof, in the case of the capacitance touch screen, whether a portion that is connected to the pad at the side thereof has high conductivity or not has been considered as a big issue.

According to the exemplary embodiment of the present invention, the electrical conductor may include an area in which the electric conductive pattern is not formed.

In order to maximize the Moire phenomenon prevention effect, the electric conductive pattern may be formed so that the area of the pattern that is formed of the figures having the asymmetric structure is larger than the entire pattern area by 10% or more. In addition, the electric conductive pattern may be formed so that the area of the figures in which at least one of the lines that connect the central point of any one figure that forms the Voronoi diagram and the central point of the adjacent figure forming the boundary in conjunction with the figure is different from the remaining lines in views of length is larger than the entire electric conductive pattern area by 10% or more.

When the electric conductive pattern is manufactured, after the pattern is designed in a limited area, the method in which the limited area is repeatedly connected is used to manufacture a large area pattern. In order to repeatedly connect the patterns, the repeating patterns may be connected to each other by fixing the positions of the dots of each quadrilateral. In this case, the limited area has the area of specifically 1 $cm^2$ or more and more specifically 10 $cm^2$ or more in order to prevent the Moire phenomenon by the regularity.

The Moire phenomenon may be avoided by the pattern, but the Moire phenomenon may be maximally avoided by controlling the line width and pitch of the conductive pattern. In detail, the fine Moire phenomenon may be prevented by including the fine line width of 100 micrometers or less, specifically 0.1 to 30 micrometers, more specifically 0.5 to 10 micrometers, and even more specifically 1 to 5 micrometers in the conductive pattern. In addition, by allowing the pitch of the conductive pattern not to be identical with the size unit of the pixel of the display, for example, in the case of the display that has the subpixel of 250 micrometers in a long axis direction, the distortion phenomenon of the color of the display due to the pixel interference may be prevented by avoiding that the pitch interval of the conductive pattern is set to 250 pitches. The Moire phenomenon according to the line width and pitch is shown in FIG. 27. As a result of evaluating the Moire phenomenon according to the change in the line width and pitch of 10 micrometers or less, in the case of 1.3 micrometers, it can be confirmed that the occurrence of the fine Moire phenomenon is removed. In addition, in the case of the 250 pitches, a rainbow light is observed. From this, the correlation with the long axis length of the pixel of the display such as LCD can be confirmed.

In the exemplary embodiment of the present invention, after the desired pattern form is determined first, the precise electric conductive pattern that has the thin line width may be formed on the transparent substrate by using a printing method, a photolithography method, a photography method, a method using a mask, a sputtering method, or an inkjet method. When the pattern form is determined, the Voronoi diagram generator may be used, such that a complex pattern form may be easily determined. Herein, the Voronoi diagram generator means the dots that are disposed so that the Voronoi diagram can be formed as described above. However, the scope of the present invention is not limited thereto, and other methods may be used when the desired pattern form is determined.

The printing method may be performed by using a method in which the paste that includes the electric conductive pattern material is transferred on the transparent substrate in the desired pattern form and then sintered. The transferring method is not particularly limited, but the above pattern form is formed on the pattern transferring medium such as an intaglio printing plate or a screen and the desired pattern may be transferred on the transparent board by using the pattern form. The method for forming the pattern form on the pattern transferring medium may be performed by using the method that is known in the art.

The printing method is not particularly limited, and a printing method such as offset printing, screen printing, gravure printing, flexo printing, and inkjet printing may be used, and among them, one or more complex method may be used. The printing method may use a roll to roll method, a roll to plate method, a plate to roll method or a plate to plate method.

The offset printing may be performed by using the method in which after the paste is filled in the intaglio printing plate on which the pattern is formed, first transferring is performed by using silicon rubber that is called the blanket, and the second transferring is performed by closely contacting the blanket and the transparent board. The screen printing may be performed by using the method in which after the paste is disposed on the screen on which the pattern is formed, the paste is directly provided on the board through the screen that has the empty space while the squeeze is pushed. The gravure printing may be performed by using the method in which after the paste is filled in the pattern while the blanket where the pattern is formed on the roll is wound, the paste is transferred on the transparent board. In the exemplary embodiment of the present invention, the above methods may be used and the above methods may be used in combination. In addition, other printing methods that are known to the person with ordinary skill in the art may be used.

In the case of the offset printing method, because of the release property of the blanket, since most of the paste is transferred on the transparent board such as glass, a separate blanket washing process is not required. The intaglio printing plate may be manufactured by precisely etching the glass on which the desired electric conductive pattern is formed, and metal or DLC (diamond-like carbon) coating may be performed on the glass surface for durability. The intaglio printing plate may be manufactured by etching the metal plate.

Figure 4:
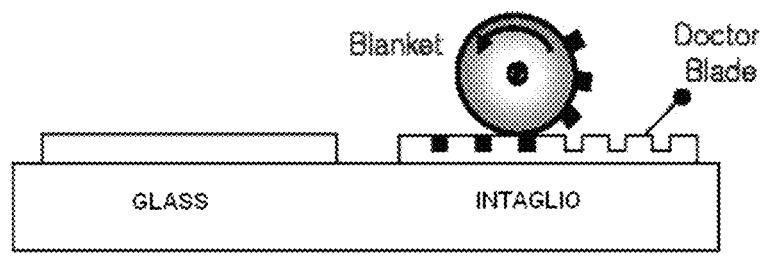
FIG. 4 is a view that illustrates an offset printing process.
Figure 4:
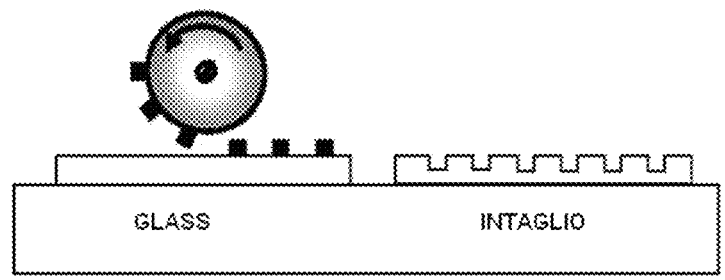
Figure 5:
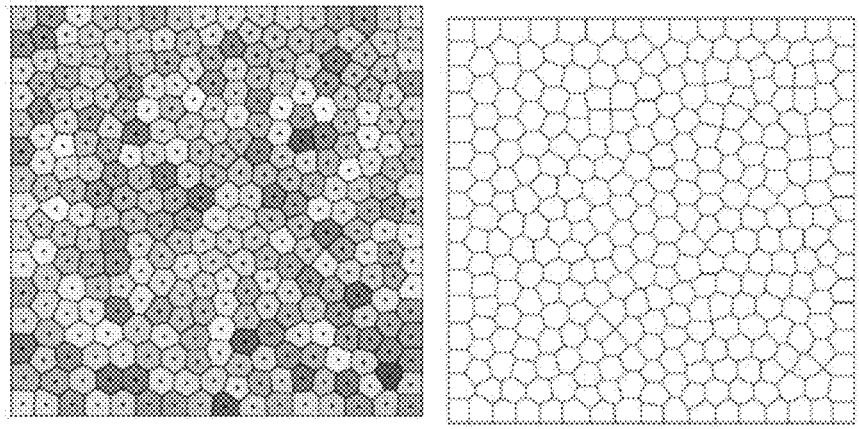
FIG. 5 illustrates forming the pattern by using the Voronoi diagram generator according to an embodiment of the present invention.

In the exemplary embodiment of the present invention, in order to implement the more precise electric conductive pattern, it is preferable to use the offset printing method. FIG. 4 illustrates the offset printing method. According to FIG. 2, after the paste is filled in the pattern of the intaglio printing plate by using the doctor blade as the first step, the first transferring is performed by rotating the blanket, and as the second step, the second transferring is performed on the surface of the transparent substrate by rotating the blanket.

In the exemplary embodiment of the present invention, the printing method is not limited to the above printing method, and the photolithography process may be used. For example, the photolithography process may be performed by using the method in which the electric conductive pattern material layer is formed on the entire surface of the transparent substrate, the photoresist layer is formed thereon. The photoresist layer is patterned by the selective exposure and developing processes, the electric conductive pattern is patterned by using the patterned photoresist layer as the mask, and the photoresist layer is removed.

The present invention may also use the photography method. For example, after the picture photosensitive material that includes silver halide is coated on the transparent substrate, the pattern may be formed by selectively exposing and developing the photosensitive material. A detailed example will be described below.

First, the photosensitive material for negative is coated on the substrate on which the pattern will be formed. In this case, as the substrate, a polymer film such as PET, acetyl celluloid and the like may be used. Herein, the polymer film material on which the photosensitive material is coated is called the film. The photosensitive material for negative may be formed of silver halide in which AgBr that is very sensitive to and regularly reacted with light and a small amount of AgI are mixed with each other. Since the image that is developed by photographing the general photosensitive material for negative is a negative picture that is opposite to the subject in terms of light and shade, the photographing may be performed by using the mask that has the pattern form that will be formed and specifically an irregular pattern form.

In order to increase the conductivity of the electric conductive pattern that is formed by using the photolithography and photography processes, a plating treatment may be further performed. The plating may use an electroless plating method, copper or nickel may be used as the plating material, and after the copper plating is performed, nickel plating may be performed thereon, but the scope of the present invention is not limited thereto.

The present invention may also use the method using the mask. For example, the patterning may be performed by depositing the electric conductive pattern material on the substrate after the mask that has the desired conductive pattern form is disposed to be close to the substrate. In this case, the depositing method may use a heat deposition method by heat or electron beam, a PVD (physical vapor deposition) method such as sputter, or a CVD (chemical vapor deposition) method using an organometal material.

In the exemplary embodiment of the present invention, the transparent substrate is not particularly limited, but the substrate where the light permeability is 50% or more may be used and specifically 75% or more. In detail, glass may be used as the transparent substrate, and the plastic substrate or plastic film may be used. As the plastic substrate or film, a material that is known in the art may be used, and for example, a material that is formed of one or more resins that are selected from polyacryls, polyurethanes, polyesters, polyepoxys, polyolefines, polycarbonates, and celluloses may be used. In more detail, the film having the visible ray permeability of 80% or more such as PET (Polyethylene terephthalate), PVB (polyvinylbutyral), PEN (polyethylene naphthalate), PES (polyethersulfon), PC (polycarbonate), and acetyl celluloid may be used. The thickness of the plastic film is specifically 12.5 to 500 micrometers, more specifically 50 to 450 micrometers, and even more specifically 50 to 250 micrometers. The plastic substrate may be a substrate that has a structure in which various functional layers such as a gas barrier layer for blocking moisture and gas on one side or both sides of the plastic film and a hard coat layer for compensating strength are layered. The functional layer that can be included in the plastic substrate is not limited thereto, and various functional layers may be provided.

The electric conductive pattern may be directly formed on parts that are included in elements or devices such as displays to which the electrical conductor of the present invention may be applied, for example, the substrate.

In the exemplary embodiment of the present invention, as the material of the electric conductive pattern, the metal that has excellent electric conductivity may be used. In addition, the specific resistance value of the electric conductive pattern material may be in the range of 1 micro Ohm cm to 200 micro Ohm cm. As a detailed example of the electric conductive pattern material, copper, silver, gold, iron, nickel, aluminum, carbon nanotube (CNT), or the like may be used, and silver may be used. The electric conductive pattern material may be used in a particle form. In the exemplary embodiment of the present invention, as the electric conductive pattern material, copper particles that are coated with silver may also be used.

In the exemplary embodiment of the present invention, in the case where the paste that includes the electric conductive pattern material is used, the paste may further include an organic binder in addition to the electric conductive pattern material described above so as to easily perform the printing process. The organic binder may have a volatile property in the sintering process. The organic binder includes a polyacryl-based resin, a polyurethane-based resin, a polyester-based resin, a polyolefin-based resin, a polycarbonate-based resin, a cellulose resin, a polyimide-based resin, a polyethylene naphthalate-based resin, and a denatured epoxy, but is not limited thereto.

In order to improve the attachment ability of the paste to the transparent substrate such as glass, the paste may further include a glass frit. The glass frit may be selected from the commercial products, but the environmentally friendly glass frit without lead component may be used. In this case, the average diameter of the used glass frit may be 2 micrometers or less and the maximum diameter thereof may be 50 micrometers or less.

If necessary, a solvent may be further added to the paste. The solvent includes butyl carbitol acetate, carbitol acetate, cyclohexanon, cellosolve acetate, terpineol, etc., but is not limited thereto.

In the exemplary embodiment of the present invention, in the case where the paste that includes the electric conductive pattern material, organic binder, glass frit, and solvent is used, the weight ratio of the electric conductive pattern may be 50 to 90%, the weight ratio of the organic binder may be 1 to 20%, the weight ratio of the glass frit may be 0.1 to 10%, and the weight ratio of the solvent may be 1 to 20%.

According to the exemplary embodiment of the present invention, the electric conductive pattern may be blackened. If the paste that includes the metal material is sintered at the high temperature, metal gloss is shown, such that the visibility may be deteriorated due to the reflection of light. The problem may be prevented by blackening the electric conductive pattern. In order to blacken the electric conductive pattern, the blackening material may be added to the paste for forming the electric conductive pattern or the blackening treatment may be performed after the paste is printed and sintered, thereby blackening the electric conductive pattern.

The blackening material that may be added to the paste includes metal oxide, carbon black, carbon nanotube, black pigment, or colored glass frit. In this case, the composition of the paste may include 50 to 90 wt % of the electric conductive pattern material, 1 to 20 wt % of the organic binder, 1 to 10 wt % of the blackening material, 0.1 to 10 wt % of the glass frit, and 1 to 20 wt % of the solvent.

When the blackening treatment is performed after the sintering, the composition of the paste may include 50 to 90 wt % of the electric conductive pattern material, 1 to 20 wt % of the organic binder, 0.1 to 10 wt % of the glass frit, and 1 to 20 wt % of the solvent. The blackening treatment after the sintering includes dipping into the oxidized solution, for example, a solution that includes the Fe or Cu ion, dipping into the solution that includes halogen ions such as a chlorine ion, dipping into hydrogen peroxide and nitric acids, and treatment using the halogen gas.

According to the exemplary embodiment of the present invention, manufacturing may be performed by dispersing the conductive pattern material, organic binder, and glass frit in the solvent. In detail, the organic binder resin solution is manufactured by dissolving the organic binder in the solvent, the glass frit is added thereto, the above metal powder as the conductive material is added thereto, the solution is kneaded, and the metal powder and the glass frit that are agglomerated are uniformly dispersed by using the three stage roll mill. However, the present invention is not limited to the above method.

The line width of the electric conductive pattern described above may be 100 micrometers or less, specifically 30 micrometers or less, and more specifically 25 micrometers or less.

In the exemplary embodiment of the present invention, in the case where the above paste is used, if the paste is sintered after being printed in the above pattern, the pattern that has the electric conductivity is formed. In this case, the sintering temperature is not particularly limited, but may be 400 to 800° C. and specifically 600 to 700° C. In the case where the transparent substrate that forms the electric conductive pattern is glass, if necessary, in the above sintering step, the glass may be shaped for the purpose. In addition, in the case where the plastic substrate or film is used as the transparent substrate that forms the electric conductive pattern, the sintering may be performed at a relatively low temperature. For example, the sintering may be performed at 50 to 350° C.

The line width of the electric conductive pattern of the electrical conductor is 100 micrometers or less, specifically 30 micrometers or less, more specifically 25 micrometers or less and specifically 5 micrometers or more. The interval between the lines of the electric conductive pattern is specifically 30 mm or less, more specifically 10 micrometers to 10 mm, more specifically 50 micrometers to 1000 micrometers, and more specifically 200 micrometers to 650 micrometers. The height of the electric conductive pattern is 1 to 100 micrometers and more specifically 3 micrometers. The line width and line height of the electric conductive pattern may be made uniform by the above methods. In the exemplary embodiment of the present invention, the uniformity of the electric conductive pattern may be in the range of ±3 micrometers in the case of the line width and in the range of ±1 micrometer in the case of the line height.

The electrical conductor according to the exemplary embodiment of the present invention may be connected to power, and in this case, the resistance value per unit area in consideration of the opening ratio is 0.01 ohm/square to 1000 ohm/square and specifically 0.05 ohm/square to 500 ohm/square at normal temperature.

The electrical conductor according to the exemplary embodiment of the present invention may be limited to the use of conducting the current by an external factor in addition to the configuration of the electrical conductor itself. In this case, the amount of flowing average current is 1 A or less on the basis per 1 min. As an example thereof, in the case where the electrical conductor according to the exemplary embodiment of the present invention is used as the electromagnetic wave shield (EMI) film, a current flow is generated in the electrical conductor by occurrence of an electromagnetic wave in a display such as PDP, and the generated current is removed through a ground portion. As another example thereof, in the case where the electrical conductor according to the exemplary embodiment of the present invention is used as one electrode layer of the touch panel, a current flow is generated by a potential difference between the electrical conductor according to the exemplary embodiment of the present invention and the opposite conductive substrate and a contact. As another example thereof, in the case where the electrical conductor according to the exemplary embodiment of the present invention is used as the auxiliary electrode for an organic light emitting diode (OLED) lighting, a current flows according to the potential of the corresponding electrode that is formed on the electrical conductor.

In the electrical conductor according to the exemplary embodiment of the present invention, the opening ratio of the electric conductive pattern, that is, the area ratio of the transparent substrate that is not covered with the pattern may be 70% or more.

The electrical conductor according to the exemplary embodiment of the present invention may be used for the purpose of requiring the electric conductivity. For example, the electrical conductor may be used in the electromagnetic wave shield film, touch panel, and a light emitting diode auxiliary electrode. The light emitting diode auxiliary electrode may be an auxiliary electrode for an organic light emitting diode (OLED) lighting.

According to the exemplary embodiment of the present invention, there are provided an electromagnetic wave shield film that includes the above electrical conductor of the present invention and a display device that includes the same. The electromagnetic wave shield film may further include a ground portion that is connected to the electric conductive pattern described above. For example, the ground portion may be formed at the edge portion of the surface on which the electric conductive pattern of the transparent substrate is formed. In addition, at least one of the reflection prevention film, near IR shield film, and color compensation film may be provided on at least one side of the electromagnetic wave shield film. According to the design specification, in addition to the above functional films, other kinds of functional films may be further included. The electromagnetic wave shield film may be applied to display devices such as a plasma display panel (PDP), a liquid crystal display (LCD), and a cathode-ray tube (CRT).

For example, the plasma display panel may include two panels; and a pixel pattern that is disposed between the two panels. The electromagnetic wave shield film may be attached to one side of the plasma display panel. In addition, the electric conductive pattern of the electromagnetic wave shield film may be provided in such a form that the pattern is directly printed on one side of the plasma display panel. In this case, the substrate of the electromagnetic wave shield film corresponds to the plasma display panel.

In the case where the substrate of the electromagnetic wave shield film according to the exemplary embodiment of the present invention is attached to the support substrate or device, the substrate may be attached by using the adhesive film. Here, any material that has an adhesive strength and is transparent after attaching may be used as the material of the adhesive film. For example, the PVB film, EVA film, PU film and the like may be used, but the material of the adhesive film is not limited thereto. The adhesive film is not particularly limited, but the thickness thereof may be in the range of 100 micrometers to 800 micrometers.

According to another exemplary embodiment of the present invention, there is provided the touch panel that includes the electrical conductor of the present invention. The touch panel according to the exemplary embodiment of the present invention may include a lower substrate; an upper substrate; and an electrode layer that is provided on at least one side of a side that is contacted with the upper substrate of the lower substrate and a side that is contacted with the lower substrate of the upper substrate or both sides. The electrode layer may perform the X axis and Y axis position detection function.

In this case, one or two of the electrode layer that is provided on the side of the upper substrate that is contacted with the lower substrate and the electrode layer that is provided on the side of the lower substrate that is contacted with the upper substrate may be the electrical conductor according to the exemplary embodiment of the present invention.

In the case where any one of the electrode layers is the electrical conductor according to the exemplary embodiment of the present invention, the other one may have the pattern that is known in the art.

In the case where all of the electrode layers are the electrical conductors according to the exemplary embodiment of the present invention, an insulation layer or a spacer may be provided between the lower substrate and the upper substrate so that the interval between the electrode layers is constantly maintained and the connection is not formed. The insulation layer may be an adhesive agent or a hot melt resin. The electrode may be connected to an external circuit.

Figure 25:
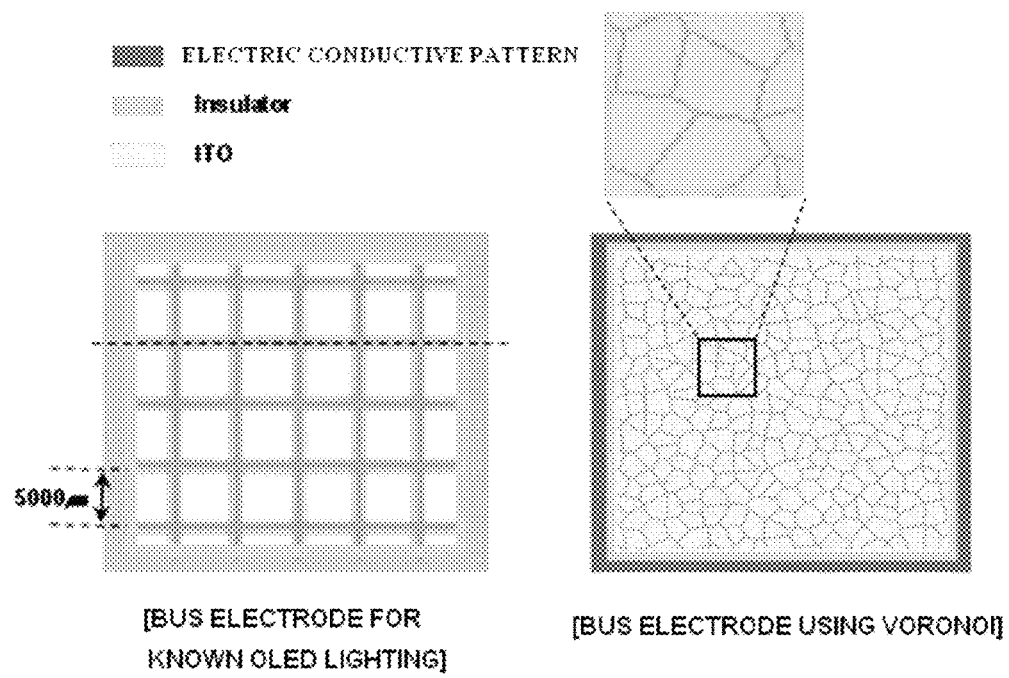
FIG. 25 and FIG. 26 illustrate the structure of the auxiliary electrode for organic light emitting diode lighting according to an embodiment of the present invention.
Figure 26:
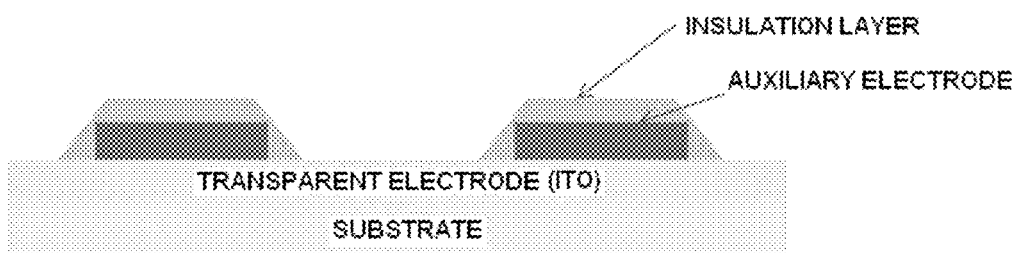

According to another exemplary embodiment of the present invention, there are provided an auxiliary electrode for an organic light emitting diode (OLED) lighting that includes the electrical conductor according to the exemplary embodiment of the present invention and the organic light emitting diode lighting that includes the same. As an example thereof, the organic light emitting diode lighting according to the exemplary embodiment of the present invention includes a first electrode, an auxiliary electrode that is disposed on the first electrode, an insulation layer that is disposed on the auxiliary electrode, an organic material layer of at least one layer, and a second electrode, and the auxiliary electrode is the electrical conductor according to the exemplary embodiment of the present invention. The auxiliary electrode may be directly formed on the first electrode, and the electrical conductor that includes the transparent substrate and the electric conductive pattern may be disposed on the first electrode. The auxiliary electrode of the organic light emitting diode lighting according to the exemplary embodiment of the present invention is shown in FIGS. 25 and 26.

MODE FOR INVENTION

Hereinafter, the present invention will be exemplified through Examples. However, the following Examples are set forth to illustrate the present invention, but the scope of the present invention is not limited thereto.

EXAMPLE

Example 1

The silver paste was manufactured by dissolving 80 wt % of silver particles that had the particle diameter of 2 micrometers, 5 wt % of polyester resin, and 5 wt % of grass frit in 10 wt % of the BCA (butyl carbitol acetate) solvent. As the intaglio printing plate, the glass that had the width of 20 micrometers, the depth of 7.5 micrometers, and the average interval between lines of 600 micrometers and the same pattern as FIG. 1 was used. In this case, when the straight line that crossed the formed pattern was drawn, the ratio (distance distribution ratio) of standard deviation in respect to an average value of distances between adjacent intersection points of the straight line and the pattern was about 30%.

After the silver pattern was formed on the glass substrate by using the method shown in FIG. 4 and the offset printer, the silver pattern was sintered at 600° C. for 3 min to form the pattern shown in FIG. 1.

Figure 17:
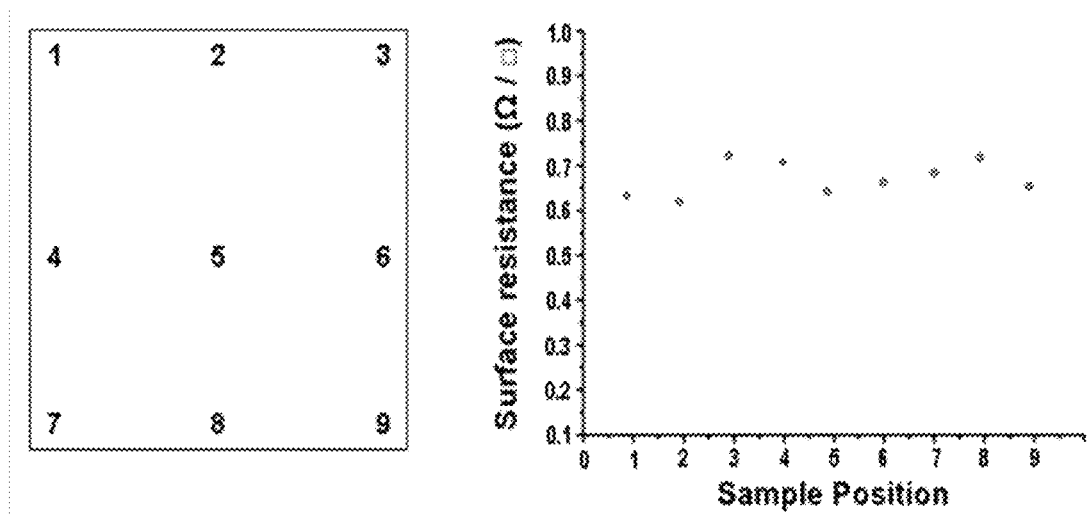
FIG. 17 illustrates the measurement results of the surface resistance value according to the position of the electrical conductor by using the electric conductive pattern according to an embodiment of the present invention.

The surface resistance of the glass substrate was 0.6 ohm/square. The surface resistance was measured at 9 positions on the glass substrate ten times, respectively. As a result, the distribution curve shown in FIG. 17 was confirmed, and in this case, the surface resistance value and distribution curve are the same as those that are shown in FIG. 17. In this case, the standard deviation was 0.018.

The 40-inch PDP was manufactured by using the glass substrate, and the Moire phenomenon thereof was observed. As a result, on the basis of the line that was vertical in respect to the surface of the PDP, no Moire pattern between 0 and 80° was observed. In addition, even when the glass substrate was rotated in respect to the PDP pixel between 0° and 45°, the Moire pattern was not observed.

Figure 15:
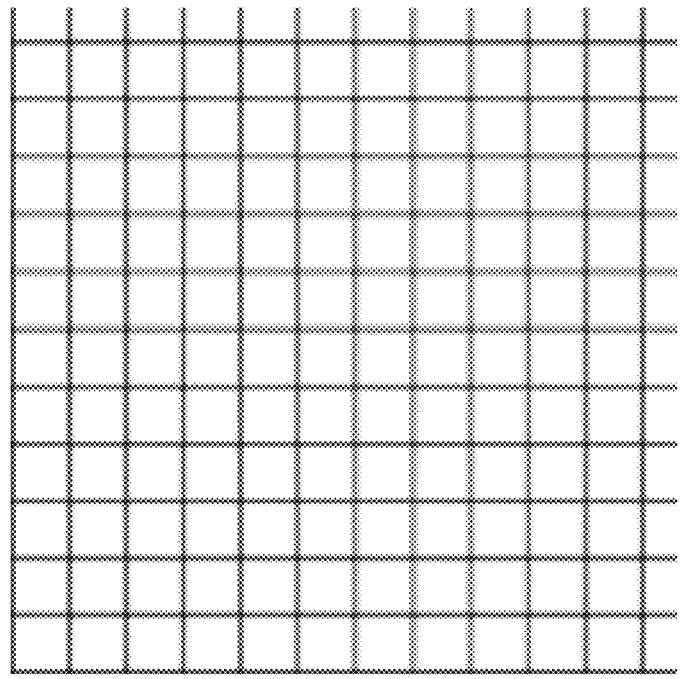
FIG. 15 and FIG. 16 illustrate the electric conductive pattern of the electrical conductor according to the related art.

FIG. 19 illustrates the result of observing the Moire phenomenon for each angle (O: observation, X: no observation)

in the case where the known pattern that is illustrated in FIG. 15 (line width of 30 micrometers, interval between lines of 300 micrometers) and the electrical conductor that had the irregular pattern manufactured in Example 1 were used, respectively.

Example 2

The silver paste was manufactured by dissolving 80 wt % of silver particles that had the particle diameter of 2 micrometers, 5 wt % of polyester resin, and 5 wt % of grass frit in 10 wt % of the BCA (butyl carbitol acetate) solvent. As the intaglio printing plate, the glass that had the width of 20 micrometers, the depth of 7.5 micrometers and the same pattern as FIG. 6 was used.

After the silver pattern was formed on the glass substrate (100 mm×100 mm) by using the method shown in FIG. 3 and the offset printer, the silver pattern was sintered at 600° C. for about 3 min to form the pattern shown in FIG. 6. In this case, when the straight line that crossed the formed pattern was drawn, the ratio (distance distribution ratio) of standard deviation in respect to an average value of distances between adjacent intersection points of the straight line and the pattern was about 50%.

The 40-inch PDP was manufactured by using the glass substrate, and the Moire phenomenon thereof was observed. As a result, on the basis of the line that was vertical in respect to the surface of the PDP, no Moire pattern between 0° and 80° was observed. In addition, even when the glass substrate was rotated in respect to the PDP pixel between 0° and 45°, the Moire pattern was not observed. The surface resistance and the Moire phenomenon observation were the same as those of FIGS. 17 and 19.

Comparative Example 1

The grid pattern on the basis of the square of 0.09 mm² was manufactured, and the figure of the pattern was the same as that of FIG. 15. In this case, when the straight line that crossed the formed pattern was drawn, the ratio (distance distribution ratio) of standard deviation in respect to an average value of distances between adjacent intersection points of the straight line and the pattern was about 0%.

The 40-inch PDP was manufactured by using the glass substrate, the Moire phenomenon thereof was observed, and the results are shown in FIG. 19 (middle column, O: observation, X: no observation).

Comparative Example 2

Figure 16:
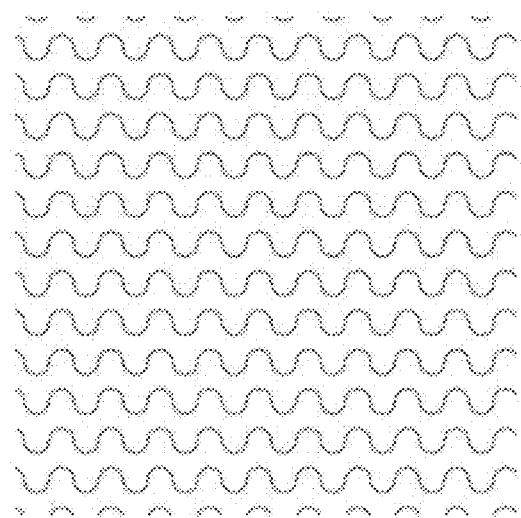

The same pattern as that of FIG. 16 was manufactured (pitch 0.3 mm). In this case, when the straight line that crossed the formed pattern was drawn, the ratio (distance distribution ratio) of standard deviation in respect to an average value of distances between adjacent intersection points of the straight line and the pattern was about 0%.

The 40-inch PDP was manufactured by using the glass substrate, and the Moire phenomenon thereof was observed. As a result, on the basis of the line that was vertical in respect to the surface of the PDP, the Moire pattern was observed with the exception of 45°, 90°, and 225°.

Example 3

The photosensitive material for negative was coated on the PET film substrate on which the pattern will be formed. The photosensitive material for negative was formed of silver halide in which AgBr that was very sensitive to and regularly reacted with light and a small amount of AgI were mixed with each other. The irregular pattern that was formed on the PET film substrate was the same as the pattern of Example 1. By using the negative mask that was configured so that light penetrates the designed pattern area and light does not penetrate an area other than the pattern, light was irradiated to the film according to the set exposure time and intensity of light. By this process, photosensitive silver on the photosensitive emulsion layer was photosensitized to form a latent image. Photosensitive silver was converted into blackened silver through the development process of the formed latent image, such that the reverse image pattern of the mask pattern was formed in a visible phase. The properties of the pattern that was made of blackened silver formed on the PET film substrate through the photograph process were shown in Table 1.

TABLE 1

| Line width (micrometer) | Line height (micrometer) | Permeability (%) |
|---|---|---|
| 20 | 6.5 | 75.6 |

The film was laminated on the glass by using the adhesive film.

The 40-inch PDP was manufactured by using the glass substrate, and the Moire phenomenon thereof was observed. As a result, on the basis of the line that was vertical in respect to the surface of the PDP, no Moire pattern between 0° and 80° was observed. In addition, even when the glass substrate was rotated in respect to the PDP pixel between 0° and 45°, the Moire pattern was not observed.

Example 4

The silver paste was manufactured by dissolving 80 wt % of silver particles that had the particle diameter of 2 micrometers, 5 wt % of polyester resin, and 5 wt % of grass frit in 10 wt % of the BCA (butyl carbitol acetate) solvent. As the intaglio printing plate, the glass that had the width of 20 micrometers, the depth of 7.5 micrometers, and the Voronoi pattern was used. The Voronoi pattern was generated by setting the square of 0.09 mm² as the basic unit and providing irregularity to the distribution of dots in the basic unit, and then the Voronoi pattern that was the same as that of FIG. 3 was manufactured. The ratio of the area distribution of the closed figure of the pattern was 23%.

After the silver pattern was formed on the glass substrate by using the method shown in FIG. 4 and the offset printer, the silver pattern was sintered at 600° C. for 3 min to form the silver line shown in FIG. 3.

Figure 18:
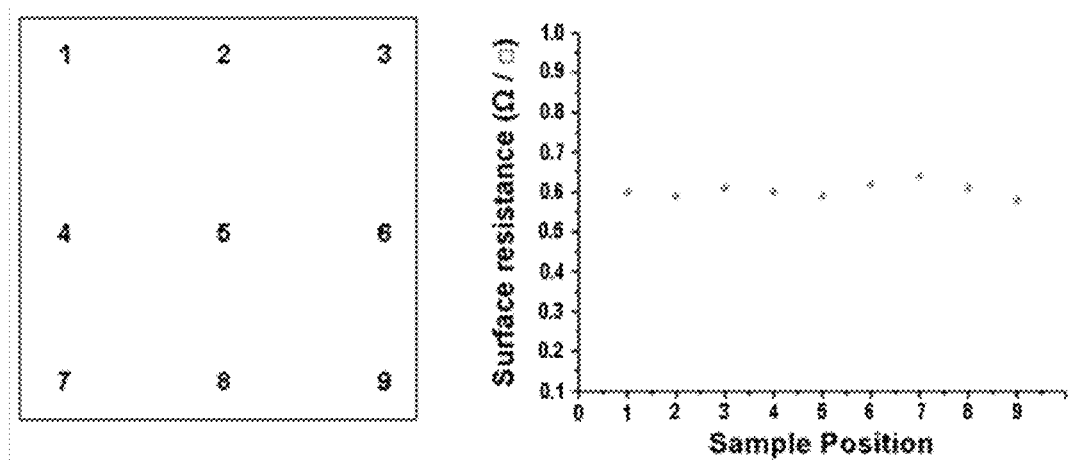
FIG. 18 illustrates the measurement results of the surface resistance value according to the position of the electrical conductor by using the electric conductive pattern according to an embodiment of the present invention.

The surface resistance of the glass substrate was 0.6 ohms/square. The surface resistance was measured at 9 positions on the glass substrate ten times, respectively, and as a result, the distribution curve shown in FIG. 18 was confirmed, and in this case, the surface resistance value and distribution curve are the same as those that are shown in FIG. 18. In this case, the standard deviation was 0.018.

The 40-inch PDP was manufactured by using the glass substrate, and the Moire phenomenon thereof was observed. As a result, on the basis of the line that was vertical in respect to the surface of the PDP, no Moire pattern between 0° and 80° was observed. In addition, even when the glass substrate was rotated in respect to the PDP pixel between 0° and 45°, the Moire pattern was not observed.

FIG. 20 illustrates the result of observing the Moire phenomenon for each angle (O: observation, X: no observation) in the case where the known pattern that is illustrated in FIG. 15 (line width of 30 micrometers, interval between lines of 300 micrometers) and the electrical conductor that had the irregular pattern manufactured in Example 4 were used, respectively.

Example 5

Figure 21:
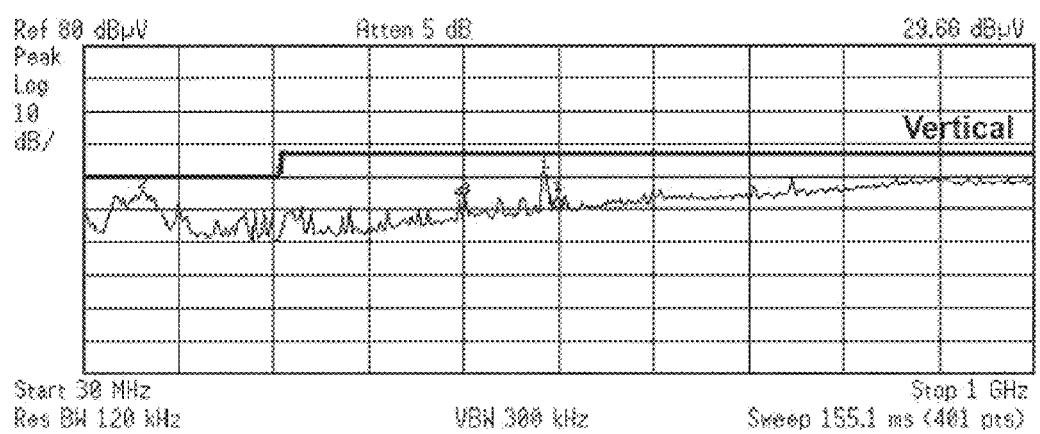
FIG. 21 illustrates the measurement results of the electromagnetic wave shield (EMI) performance in the range of frequency of 30 to 1000 MHz when the electrical conductor that includes the electric conductive pattern is used as the electromagnetic wave shield (EMI) filter of PDP.
Figure 21:
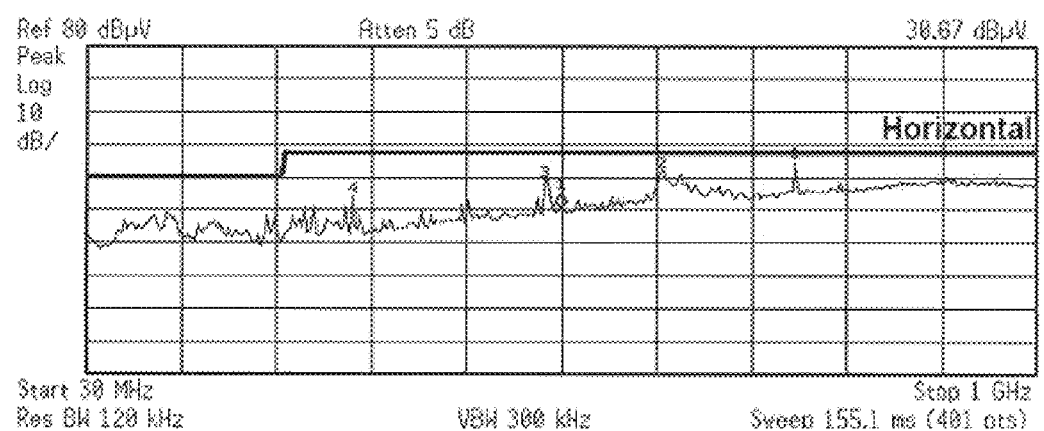

After the conductive pattern that was manufactured by using the method of Example 4 was grounded, when the conductive pattern was used as the electromagnetic wave shield filter of the 40-inch PDP, the EMI level that was emitted from the distance of 3 m was measured, and the results were shown in FIG. 21.

Example 6

Figure 22:
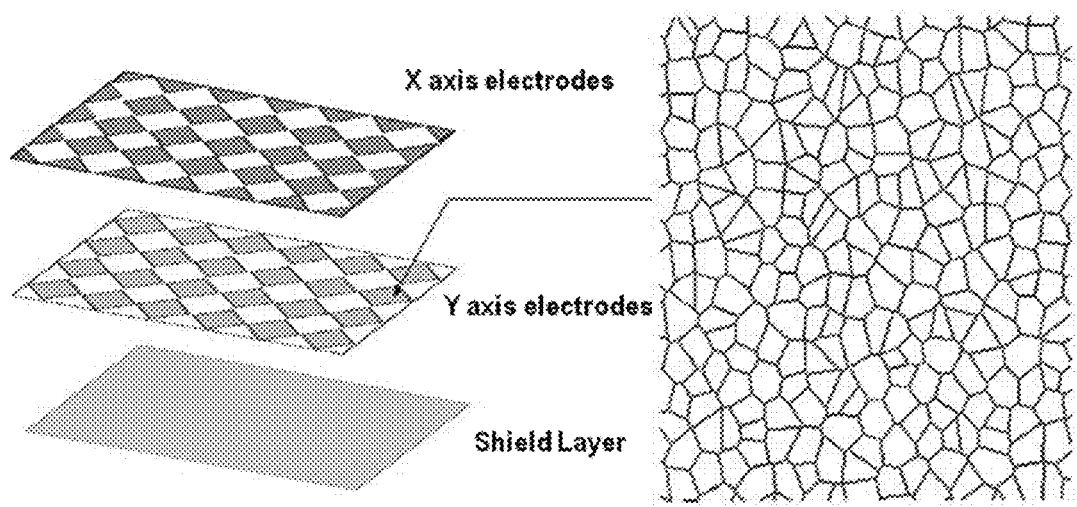
FIG. 22 illustrates the structure of the touch screen that includes the electric conductive pattern according to an embodiment of the present invention.
Figure 23:
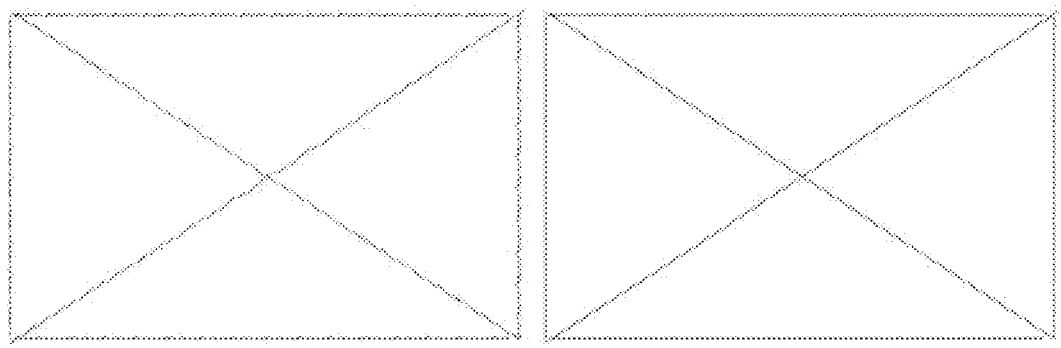
FIG. 23 illustrates the comparison of the result of linearity evaluation that shows the precision of the touch screen with the result of the touch screen that has a known transparent conductive substrate (ITO)

After the touch screen that had the same shape as that of FIG. 22 was manufactured by using the pattern that was manufactured by using the method of Example 4, the linearity evaluation was performed by using the touch screen. The results were the same as those of FIG. 23. In this case, the linearity error of the known touch screen on the basis of ITO was 2 pixels, whereas it was confirmed that the linearity error of the touch screen using the electrical conductor on the basis of printing manufactured by using the method of Example 4, was 1 pixel or less.

Example 7

The blackening treatment was performed by using the pattern that was manufactured by using the method of Example 4. In detail, the blackening treatment was performed by dipping the manufactured conductive pattern substrate in 1% of the $FeCl_3$ (Kanto Chemical Co. Ltd., 16019-02) aqueous solution at normal temperature for 1 min.

Figure 24:
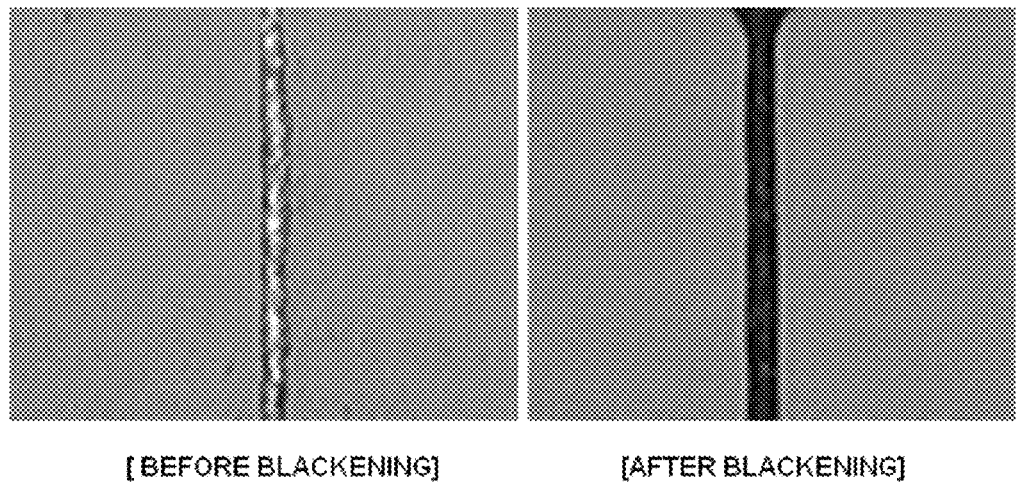
FIG. 24 illustrates pictures before and after the blackening treatment of the electrical conductor that is manufactured in the embodiment.

It was confirmed that the reflectivity of Ag can be largely improved by blackening treatment so that there is no problem in terms of visibility. The picture that illustrates the reflectivity before and after the blackening was shown in FIG. 24.

What is claimed is:

1. An electrical conductor comprising:
   a transparent substrate; and
   an electric conductive pattern on at least one side of the transparent substrate,
   when a straight line that crosses the electric conductive pattern is drawn, wherein 30% or more of the entire area of the transparent substrate has the electric conductive pattern in which a ratio (distance distribution ratio) of standard deviation in respects to an average value of distances between adjacent intersection points of the straight line and the electric conductive pattern is 2% or more,
   wherein in the electrical conductor, the opening ratio is 70% or more.

2. The electrical conductor according to claim 1, wherein the straight line that crosses the electric conductive pattern is a line in which the standard deviation of the distances between adjacent intersection points of the straight line and the electric conductive pattern is the smallest value.

3. The electrical conductor according to claim 1, wherein the straight line that crosses the electric conductive pattern is a straight line that vertically extends in respects to the tangent line of any one point of the electric conductive pattern.

4. The electrical conductor according to claim 1, wherein the straight line that crosses the electric conductive pattern has 80 or more intersection points with the electric conductive pattern.

5. The electrical conductor according to claim 1, wherein the ratio (distance distribution ratio) of standard deviation in respects to the average value of distances between adjacent intersection points of the straight line that crosses the electric conductive pattern and the electric conductive pattern is 20% or more.

6. The electrical conductor according to claim 1, wherein the electric conductive pattern has a boundary type pattern of figures that form a Voronoi diagram.

7. The electrical conductor according to claim 1, wherein in the electric conductive pattern, a line width is 100 micrometers or less, an interval between lines is 30 mm or less, and a height of the line from the surface of the transparent substrate is in the range of 1 to 100 micrometers.

8. The electrical conductor according to claim 1, wherein the permeability deviation in respects to a predetermined circle that has a diameter of 20 cm is 5% or less.

9. The electrical conductor according to claim 1, wherein the transparent substrate is glass, plastic substrate or plastic film.

10. The electrical conductor according to claim 1, wherein in the electrical conductor, the resistance value per unit area is in the range of 0.01 ohm/square to 1000 ohm/square at normal temperature.

11. The electrical conductor according to claim 1, wherein the electrical conductor is configured so that a current is conducted by an external factor.

12. The electrical conductor according to claim 1, wherein the average current is 1 A or less on the basis of 1 min.

13. The electrical conductor according to claim 1, wherein the electric conductive pattern is blackened.

14. An electromagnetic wave shield film comprising the electrical conductor according to claim 1.

15. The electromagnetic wave shield film according to claim 14, further comprising a ground portion that is provided at an edge portion of a side on which the electric conductive pattern of the transparent substrate is provided.

16. A touch panel comprising the electrical conductor according to claim 1.

17. The touch panel according to claim 16, wherein the touch panel includes:
    a lower substrate;
    an upper substrate; and
    an electrode layer that is provided on at least one side of a side of the lower substrate that is contacted with the upper substrate and a side of the upper substrate that is contacted with the lower substrate,
    wherein one or two of the electrode layer that is provided on the side of the lower substrate that is contacted with the upper substrate and the electrode layer that is provided on the side of the upper substrate that is contacted with the lower substrate is the electrical conductor.

18. An organic light emitting diode lighting comprising the electrical conductor according to claim 1 as an auxiliary electrode.

19. A production method for an electrical conductor, the production method comprising:
    forming an electric conductive pattern on a transparent substrate,
    when a straight line that crosses the electric conductive pattern is drawn, wherein 30% or more of the entire area of the transparent substrate has the electric conductive pattern in which a ratio (distance distribution ratio) of standard deviation in respects to an average value of distances between adjacent intersection points of the straight line and the electric conductive pattern is 2% or more, wherein in the electrical conductor, the opening ratio is 70% or more.

20. The production method for an electrical conductor according to claim 19, wherein the electric conductive pattern is formed by using a printing method, a photolithography method, a photography method, a method using a mask, a sputtering method, or an inkjet method.

21. The production method for an electrical conductor according to claim 19, further comprising before the electric conductive pattern is formed on the transparent substrate, determining the electric conductive pattern by using a Voronoi diagram generator.

22. The production method for an electrical conductor according to claim 19, wherein in the electric conductive pattern, a line width is 100 micrometers or less, an interval between lines is 30 mm or less, and a height of the line from the surface of the transparent substrate is in the range of 1 to 100 micrometers.

23. An electrical conductor comprising:

a transparent substrate; and an electric conductive pattern that is provided on at least one side of the transparent substrate, wherein 30% or more of the entire area of the transparent substrate is formed of closed figures in which distributions are continuous, and the electrical conductor has the electric conductive pattern in which a ratio (area distribution ratio) of standard deviation in respects to an average value of areas of the closed figures is 2% or more, wherein in the electrical conductor, the opening ratio is 70% or more.

24. The electrical conductor according to claim 23, wherein 30% or more of the entire area of the transparent substrate is formed of closed figures in which distributions are continuous, and the electrical conductor has the electric conductive pattern in which a ratio (area distribution ratio) of standard deviation in respects to an average value of areas of the closed figures is 20% or more.

25. The electrical conductor according to claim 23, wherein there are at least 100 closed figures.

26. The electrical conductor according to claim 23, wherein the electric conductive pattern has a boundary type pattern of figures that form a Voronoi diagram.

27. The electrical conductor according to claim 23, wherein the electric conductive pattern has a boundary type pattern of figures that are formed of at least one triangle that forms a Delaunay pattern.

28. The electrical conductor according to claim 23, wherein in the electric conductive pattern, a line width is 100 micrometers or less, an interval between lines is 30 mm or less, and a height of the line from the surface of the transparent substrate is in the range of 1 to 100 micrometers.

29. The electrical conductor according to claim 23, wherein the permeability deviation in respects to a predetermined circle that has a diameter of 20 cm is 5% or less.

30. The electrical conductor according to claim 23, wherein the transparent substrate is glass, plastic substrate or plastic film.

31. The electrical conductor according to claim 23, wherein in the electrical conductor, the resistance value per unit area is in the range of 0.01 ohm/square to 1000 ohm/square at normal temperature.

32. The electrical conductor according to claim 23, wherein the electrical conductor is configured so that a current is conducted by an external factor.

33. The electrical conductor according to claim 23, wherein the average current is 1 A or less on the basis of 1 min.

34. The electrical conductor according to claim 23, wherein the electric conductive pattern is blackened.

35. An electromagnetic wave shield film comprising the electrical conductor according to claim 23.

36. The electromagnetic wave shield film according to claim 35, further comprising a ground portion that is provided at an edge portion of a side on which the electric conductive pattern of the transparent substrate is provided.

37. A touch panel comprising the electrical conductor according to claim 23.

38. The touch panel according to claim 37, wherein the touch panel includes:

a lower substrate;

an upper substrate; and an electrode layer that is provided on at least one side of a side of the lower substrate that is contacted with the upper substrate and a side of the upper substrate that is contacted with the lower substrate, wherein one or two of the electrode layer that is provided on the side of the lower substrate that is contacted with the upper substrate and the electrode layer that is provided on the side of the upper substrate that is contacted with the lower substrate is the electrical conductor.

39. An organic light emitting diode lighting comprising the electrical conductor according to claim 23 as an auxiliary electrode.

40. A production method for an electrical conductor, the production method comprising:

forming an electric conductive pattern on a transparent substrate, wherein 30% or more of the entire area of the transparent substrate is formed of closed figures in which distributions are continuous, and the electrical conductor has the electric conductive patter in which a ratio (area distribution ration) of standard deviation in respects to an average value of areas of the closed figures is 2% or more, and wherein in the electrical conductor, the opening ratio is 70% or more.

41. The production method for an electrical conductor according to claim 40, wherein the electric conductive pattern is formed by using a printing method, a photolithography method, a photography method, a method using a mask, a sputtering method, or an inkjet method.

42. The production method for an electrical conductor according to claim 40, further comprising before the electric conductive pattern is formed on the transparent substrate, determining the electric conductive pattern by using a Voronoi diagram generator or a Delaunay pattern generator.

43. The production method for an electrical conductor according to claim 40, wherein in the electric conductive pattern, a line width is 100 micrometers or less, an interval between lines is 30 mm or less, and a height of the line from the surface of the transparent substrate is in the range of 1 to 100 micrometers.

\* \* \* \* \*